United States Patent
Yang et al.

(10) Patent No.: US 10,560,049 B2
(45) Date of Patent: Feb. 11, 2020

(54) SYSTEM AND METHOD FOR PACKAGING PHOTOVOLTAIC ROOF TILES

(71) Applicant: TESLA, INC., Palo Alto, CA (US)

(72) Inventors: Bobby Yang, Dublin, CA (US); Peter P. Nguyen, San Jose, CA (US); Piotr Zajac, Foster City, CA (US); Scott Tripp, Milpitas, CA (US); Seth M. Winger, Palo Alto, CA (US); Kaleb A. Klauber, Oakland, CA (US); Brian E. Atchley, Petaluma, CA (US); Charles Almy, Berkeley, CA (US); Andreas Meisel, San Jose, CA (US); Alex Mayer, San Francisco, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/909,181

(22) Filed: Mar. 1, 2018

(65) Prior Publication Data
US 2018/0254738 A1    Sep. 6, 2018

Related U.S. Application Data

(60) Provisional application No. 62/465,694, filed on Mar. 1, 2017.

(51) Int. Cl.
*H02S 20/25*    (2014.01)
*H02S 40/34*    (2014.01)
(Continued)

(52) U.S. Cl.
CPC ............... *H02S 20/25* (2014.12); *E04D 1/30* (2013.01); *H01L 31/0201* (2013.01);
(Continued)

(58) Field of Classification Search
CPC .......... H02S 20/25; H02S 40/34; H02S 40/36; H01L 31/1876; E04D 1/30
(Continued)

(56) References Cited

U.S. PATENT DOCUMENTS 352,424 A * 11/1886 Owen ...................... E04D 1/34
                                                            52/23
3,076,861 A    2/1963 Samulon
(Continued)

FOREIGN PATENT DOCUMENTS

CN    102544380    8/2015
CN    103426957    3/2016
(Continued)

OTHER PUBLICATIONS

Bulucani et al., "A new approach: low cost masking material and efficient copper metallization for higher efficiency silicon solar cells" 2015 IEEE.
(Continued)

*Primary Examiner* — Patrick J Maestri
*Assistant Examiner* — Joseph J. Sadlon
(74) *Attorney, Agent, or Firm* — Kilpatrick Townsend & Stockton LLP

(57) ABSTRACT

One embodiment can provide a photovoltaic roof module. The photovoltaic roof module can include a plurality photovoltaic roof tiles. A respective photovoltaic roof tile can include a glass front cover, a back cover that includes glass of photovoltaic backsheet, and a plurality of photovoltaic structures encapsulated between the glass front cover and the back cover by an encapsulant. The photovoltaic roof tile can be configured to function as a roof tile when placed on a rooftop of a building, thereby protecting the building from weather elements.

14 Claims, 25 Drawing Sheets

(51) Int. Cl.
*H02S 40/36* (2014.01)
*H01L 31/02* (2006.01)
*H01L 31/048* (2014.01)
*H01L 31/18* (2006.01)
*E04D 1/30* (2006.01)
*E04D 1/34* (2006.01)

(52) U.S. Cl.
CPC ...... *H01L 31/0488* (2013.01); *H01L 31/1876* (2013.01); *H02S 40/34* (2014.12); *H02S 40/36* (2014.12); *E04D 1/34* (2013.01); *E04D 2001/308* (2013.01); *E04D 2001/3458* (2013.01); *E04D 2001/3494* (2013.01)

(58) Field of Classification Search
USPC ...................................................... 52/173.3
See application file for complete search history.

(56) References Cited

U.S. PATENT DOCUMENTS

| | | | | |
|---|---|---|---|---|
| 3,369,939 | A | 2/1968 | Myer | |
| 3,461,602 | A * | 8/1969 | Hasel | A63H 33/08 446/124 |
| 4,239,810 | A | 12/1980 | Alameddine | |
| 4,623,753 | A * | 11/1986 | Feldman | H01R 4/2483 174/50 |
| 4,724,011 | A * | 2/1988 | Turner | H01L 31/022425 136/244 |
| 4,946,512 | A * | 8/1990 | Fukuroi | E04D 1/24 136/248 |
| 5,112,408 | A * | 5/1992 | Melchior | H02S 20/25 136/251 |
| 5,118,540 | A | 6/1992 | Hutchison | |
| 5,316,592 | A * | 5/1994 | Dinwoodie | E04D 11/02 136/244 |
| 5,338,369 | A * | 8/1994 | Rawlings | H02S 20/23 136/246 |
| 5,427,961 | A | 6/1995 | Takenouchi | |
| 5,590,495 | A * | 1/1997 | Bressler | H01L 31/048 136/244 |
| 5,667,596 | A | 9/1997 | Tsuzuki | |
| 5,942,048 | A | 8/1999 | Fujisaki | |
| 6,133,522 | A | 10/2000 | Kataoka | |
| 6,311,436 | B1 | 11/2001 | Mimura | |
| 6,365,824 | B1 * | 4/2002 | Nakazima | H01L 31/048 136/251 |
| 6,472,594 | B1 | 10/2002 | Ichinose | |
| 6,586,271 | B2 * | 7/2003 | Hanoka | B32B 17/10302 136/244 |
| 6,883,290 | B2 * | 4/2005 | Dinwoodie | E04D 1/18 52/748.1 |
| 6,960,716 | B2 * | 11/2005 | Matsumi | H02S 20/23 136/244 |
| 7,259,321 | B2 | 8/2007 | Oswald | |
| 7,276,724 | B2 | 10/2007 | Sheats | |
| 7,328,534 | B2 * | 2/2008 | Dinwoodie | H01L 31/052 52/173.3 |
| 7,506,477 | B2 * | 3/2009 | Flaherty | E04D 1/08 136/244 |
| 7,534,956 | B2 * | 5/2009 | Kataoka | H01L 31/048 136/243 |
| 7,772,484 | B2 * | 8/2010 | Li | H01G 9/2027 136/244 |
| 7,833,808 | B2 | 11/2010 | Xu | |
| 7,851,700 | B2 | 12/2010 | Luch | |
| 7,858,874 | B2 * | 12/2010 | Ruskin | E04D 1/26 136/244 |
| 7,902,451 | B2 | 3/2011 | Shimizu | |
| 7,964,440 | B2 | 6/2011 | Salleo | |
| 8,141,306 | B2 * | 3/2012 | Masuda | H02S 20/23 52/173.3 |
| 8,205,400 | B2 * | 6/2012 | Allen | H01L 31/048 136/244 |
| 8,206,664 | B2 | 6/2012 | Lin | |
| 8,276,329 | B2 * | 10/2012 | Lenox | E04D 13/172 52/173.3 |
| 8,471,141 | B2 | 6/2013 | Stancel | |
| 8,664,030 | B2 * | 3/2014 | Luch | H01L 31/02008 136/245 |
| 8,674,377 | B2 | 3/2014 | Farquhar | |
| 8,697,981 | B2 * | 4/2014 | Adriani | H02S 20/25 136/251 |
| 8,701,360 | B2 * | 4/2014 | Ressler | E04D 1/08 136/244 |
| 8,713,861 | B2 * | 5/2014 | Desloover | E04D 1/08 52/173.3 |
| 8,740,642 | B2 * | 6/2014 | Keenihan | E04D 1/34 52/23 |
| 8,763,322 | B2 * | 7/2014 | Hamamura | F24S 25/636 52/173.3 |
| 8,822,810 | B2 * | 9/2014 | Luch | H01L 31/02008 136/244 |
| 8,869,470 | B2 * | 10/2014 | Lanza | E04D 1/30 52/173.3 |
| 9,038,330 | B2 * | 5/2015 | Bellavia | E04D 1/34 52/173.3 |
| 9,150,966 | B2 | 10/2015 | Xu | |
| 9,206,520 | B2 | 12/2015 | Barr | |
| 9,343,592 | B2 * | 5/2016 | Hunt | H01L 31/02013 |
| 9,362,527 | B2 | 6/2016 | Takemura | |
| 9,412,884 | B2 * | 8/2016 | Heng | H01L 31/0504 |
| 9,525,092 | B2 * | 12/2016 | Mayer | H01L 31/055 |
| 9,685,579 | B2 * | 6/2017 | Gonzalez | E04D 1/30 52/173.3 |
| 9,825,582 | B2 * | 11/2017 | Fernandes | H02S 20/25 |
| 9,899,554 | B2 * | 2/2018 | Yang | H01L 31/0201 |
| 9,966,487 | B2 * | 5/2018 | Magnusdottir | H01L 31/0201 |
| 10,151,114 | B2 * | 12/2018 | Stearns | E04D 13/00 |
| 2001/0054435 | A1 | 12/2001 | Nagao | |
| 2002/0015782 | A1 | 2/2002 | Abys | |
| 2003/0180983 | A1 | 9/2003 | Oswald | |
| 2004/0261840 | A1 | 12/2004 | Schmit | |
| 2005/0022857 | A1 * | 2/2005 | Daroczi | E04D 1/18 52/748.1 |
| 2005/0039788 | A1 | 2/2005 | Blieske | |
| 2005/0268963 | A1 | 12/2005 | Jordan | |
| 2006/0048798 | A1 | 3/2006 | McCoy | |
| 2006/0086620 | A1 | 4/2006 | Chase | |
| 2006/0204730 | A1 | 9/2006 | Nakamura | |
| 2008/0135085 | A1 | 6/2008 | Corrales | |
| 2009/0101192 | A1 | 4/2009 | Kothari | |
| 2009/0120497 | A1 | 5/2009 | Schetty | |
| 2009/0133739 | A1 | 5/2009 | Shiao | |
| 2009/0133740 | A1 | 5/2009 | Shiao | |
| 2009/0233083 | A1 | 9/2009 | Inoue | |
| 2009/0242021 | A1 | 10/2009 | Petkie | |
| 2009/0287446 | A1 | 11/2009 | Wang | |
| 2009/0308435 | A1 | 12/2009 | Caiger | |
| 2010/0000603 | A1 | 1/2010 | Tsuzuki | |
| 2010/0006147 | A1 | 1/2010 | Nakashima | |
| 2010/0018568 | A1 | 1/2010 | Nakata | |
| 2010/0132762 | A1 | 6/2010 | Graham | |
| 2010/0147363 | A1 | 6/2010 | Huang | |
| 2010/0180929 | A1 | 7/2010 | Raymond | |
| 2011/0023937 | A1 | 2/2011 | Daniel | |
| 2011/0023942 | A1 | 2/2011 | Soegding | |
| 2011/0030761 | A1 | 2/2011 | Kalkanoglu | |
| 2011/0047902 | A1 * | 3/2011 | Cryar | E04D 1/26 52/173.3 |
| 2011/0277825 | A1 | 11/2011 | Fu | |
| 2012/0012162 | A1 | 1/2012 | Kobayashi | |
| 2012/0031470 | A1 | 2/2012 | Dimov | |
| 2012/0048349 | A1 | 3/2012 | Metin | |
| 2012/0060911 | A1 | 3/2012 | Fu | |
| 2012/0125391 | A1 | 5/2012 | Pinarbasi | |
| 2012/0199184 | A1 | 8/2012 | Nie | |
| 2012/0237670 | A1 | 9/2012 | Lim | |
| 2013/0048062 | A1 | 2/2013 | Min | |
| 2013/0061913 | A1 | 3/2013 | Willham | |
| 2013/0160823 | A1 | 6/2013 | Khouri | |
| 2013/0206213 | A1 | 8/2013 | He | |

(56) References Cited

U.S. PATENT DOCUMENTS

| | | |
|---|---|---|
| 2013/0209776 A1 | 8/2013 | Kim |
| 2013/0233378 A1 | 9/2013 | Moslehi |
| 2013/0247959 A1 | 9/2013 | Kwon |
| 2013/0255755 A1 | 10/2013 | Chich |
| 2013/0280521 A1 | 10/2013 | Mori |
| 2014/0120699 A1 | 5/2014 | Hua |
| 2014/0124014 A1* | 5/2014 | Morad .................. H01L 31/042 136/246 |
| 2014/0196768 A1 | 7/2014 | Heng et al. |
| 2014/0313574 A1 | 10/2014 | Bills |
| 2014/0360582 A1 | 12/2014 | Cui |
| 2015/0090314 A1 | 4/2015 | Yang |
| 2015/0155824 A1 | 6/2015 | Chien |
| 2015/0194552 A1 | 7/2015 | Ogasahara |
| 2015/0243931 A1 | 8/2015 | Fukuura |
| 2015/0270410 A1 | 9/2015 | Heng |
| 2015/0349145 A1 | 12/2015 | Morad |
| 2015/0349152 A1 | 12/2015 | Voss |
| 2015/0349703 A1 | 12/2015 | Morad |
| 2016/0013329 A1 | 1/2016 | Brophy |
| 2016/0105144 A1 | 4/2016 | Haynes |
| 2016/0163902 A1 | 6/2016 | Podlowski |
| 2016/0181446 A1 | 6/2016 | Kalkanoglu |
| 2016/0225931 A1 | 8/2016 | Heng |
| 2017/0033250 A1 | 2/2017 | Ballif |
| 2017/0077343 A1 | 3/2017 | Morad |
| 2017/0194516 A1 | 7/2017 | Reddy |
| 2017/0222082 A1 | 8/2017 | Lin |
| 2018/0166601 A1 | 6/2018 | Inaba |

FOREIGN PATENT DOCUMENTS

| | | |
|---|---|---|
| CN | 102956730 | 6/2016 |
| DE | 102007054124 | 5/2009 |
| EP | 1058320 | 12/2000 |
| EP | 2051124 A2 | 4/2009 |
| EP | 2709160 | 3/2014 |
| GB | 2278618 | 12/1994 |
| JP | S57141979 | 9/1982 |
| JP | S6020586 | 2/1985 |
| JP | H06140657 | 5/1994 |
| JP | H06264571 | 9/1994 |
| JP | 2000091610 | 3/2000 |
| JP | 2000216415 | 8/2000 |
| JP | 2013211385 | 10/2013 |
| WO | 2008136872 | 11/2008 |
| WO | 2009062106 | 5/2009 |
| WO | 2009099418 | 8/2009 |
| WO | 2010128375 | 11/2010 |
| WO | WO-2011128757 A1 * | 10/2011 ........... H01L 31/048 |
| WO | 201359441 | 4/2013 |
| WO | 2013067541 | 5/2013 |
| WO | 2013102181 | 7/2013 |
| WO | 2014178180 | 11/2014 |
| WO | 2015155356 | 10/2015 |
| WO | 2016090341 | 6/2016 |

OTHER PUBLICATIONS

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

"Recovery Act: Organic Coatings as Encapsulants for Low Cost, High Performance PV Modules" Jim Poole et al. Nov. 16, 2011.

Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.

\* cited by examiner

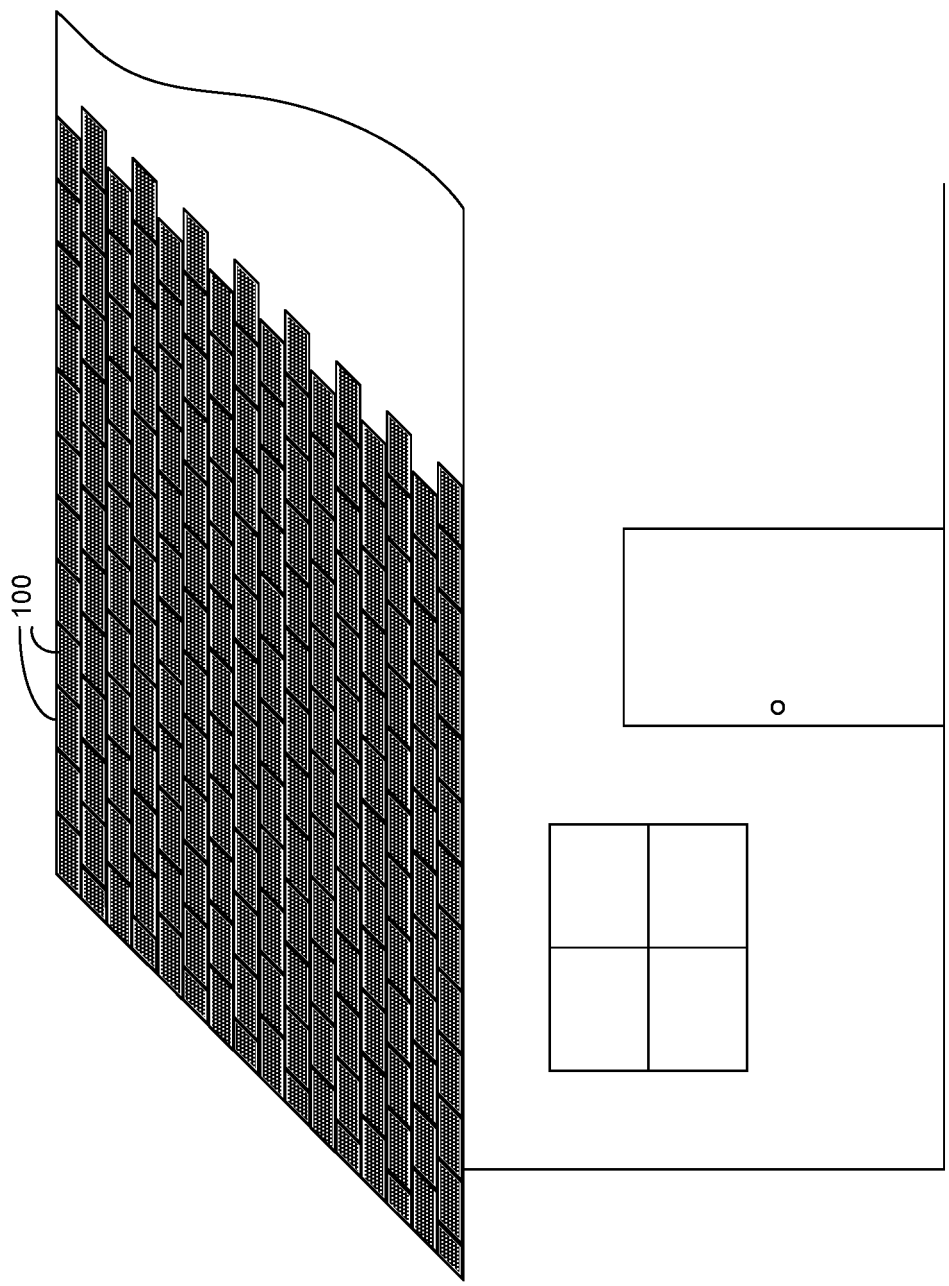

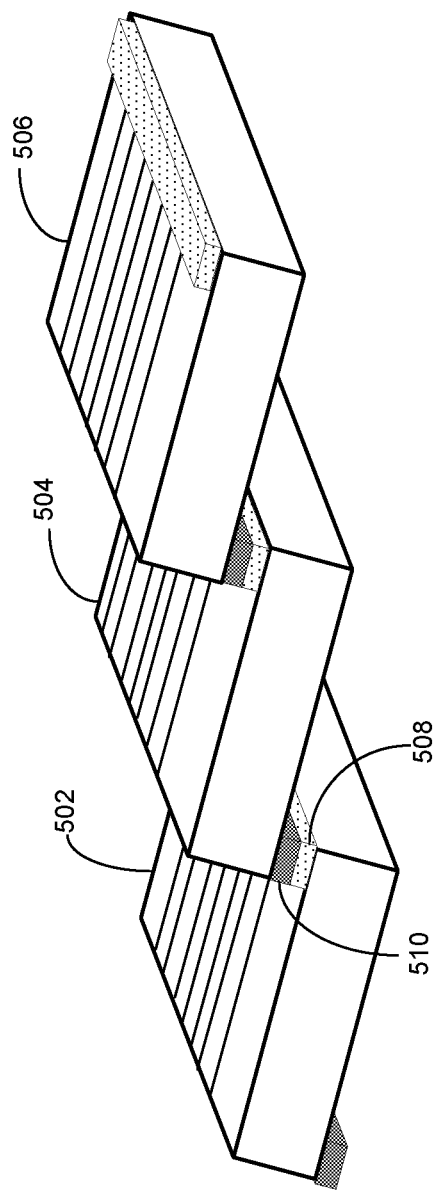
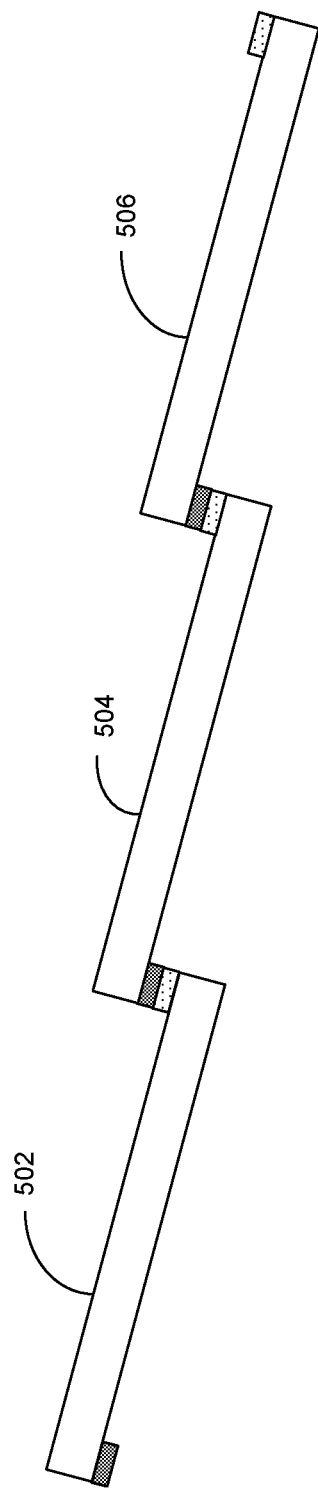
FIG. 5A
FIG. 5B

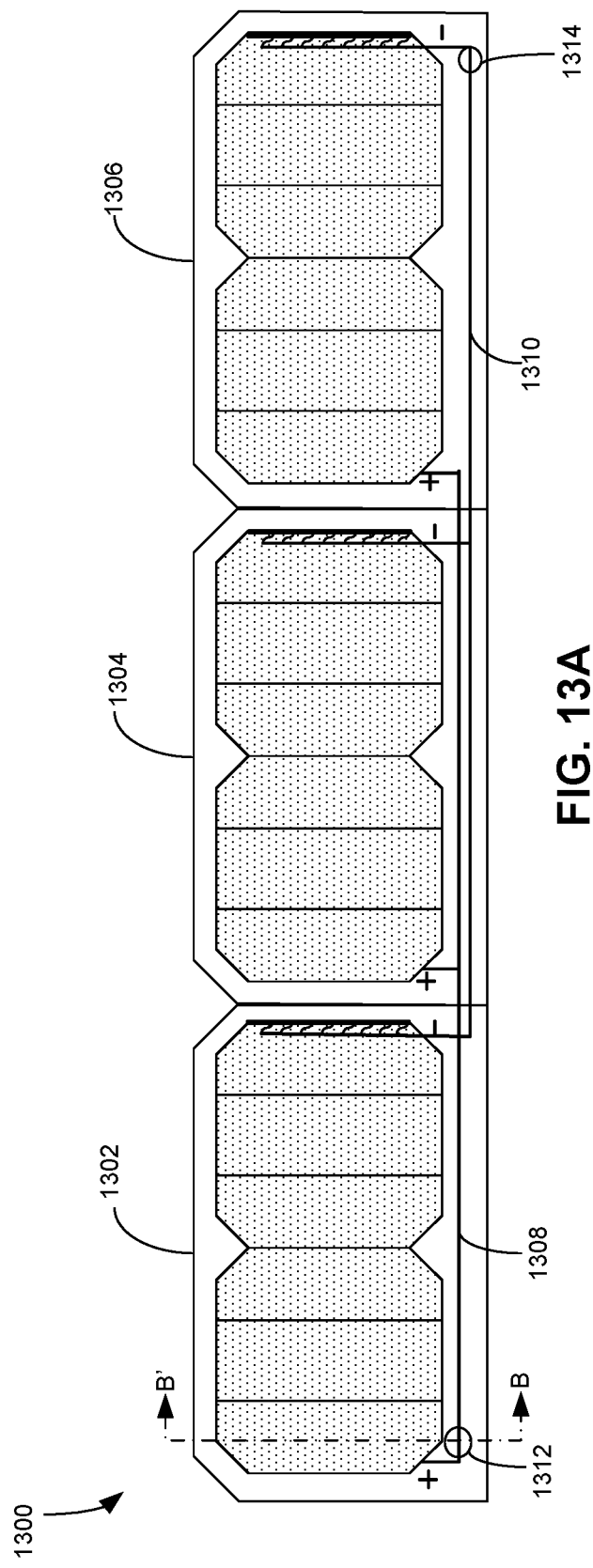
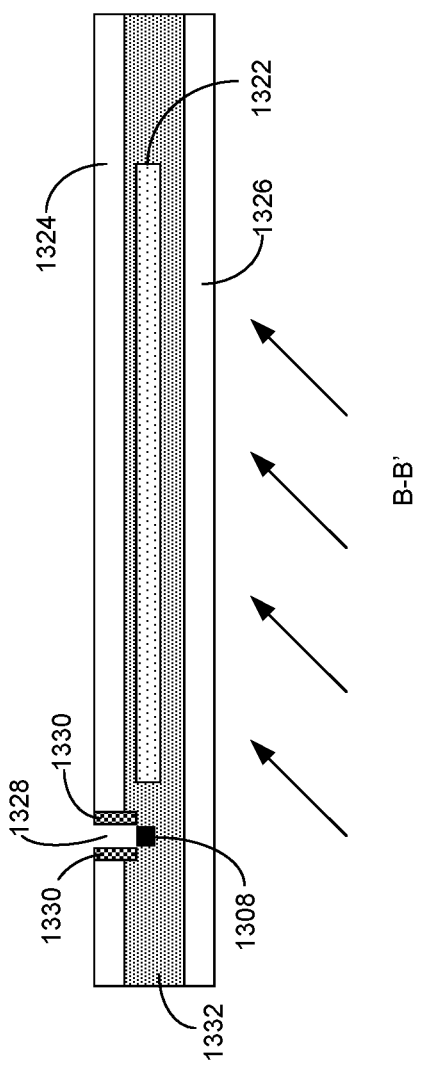
FIG. 13A
FIG. 13B

SYSTEM AND METHOD FOR PACKAGING PHOTOVOLTAIC ROOF TILES

RELATED APPLICATIONS

This claims the benefit of U.S. Provisional Application No. 62/465,694, entitled "SYSTEM AND METHOD FOR PACKAGING PHOTOVOLTAIC ROOF TILES," by inventors Brian Atchley, Charles Almy, Andreas Meisel, Alex Mayer, Bobby Yang, Seth M. Winger, and Peter P. Nguyen, filed 1 Mar. 2017.

BACKGROUND

Field

This disclosure generally related to the fabrication of photovoltaic structures. More specifically, this disclosure is related to the fabrication of photovoltaic roof tiles.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically enclose fewer solar cells than a conventional solar panel. The front and back covers can be fortified glass or other material that can protect the PV cells from the weather elements. Note that a typical roof tile may have a dimension of 15 in×8 in=120 $in^2$=774 $cm^2$, and a typical solar cell may have a dimension of 6 in×6 in =36 $in^2$=232 $cm^2$. Similar to a conventional PV panel, the PV roof tile can include an encapsulating layer, such as an organic polymer. A lamination process can seal the solar cells between the front and back covers.

Packaging high-efficiency solar cells into a roof shingle or tile that can withstand different and sometimes extreme weather conditions is not simple. For easy installation, multiple roof shingles or tiles can be fabricated together as a module. Electrical interconnections among individual solar shingles or tiles within a module need to be protected against weather elements.

SUMMARY

One embodiment can provide a photovoltaic roof module. The photovoltaic roof module can include a plurality photovoltaic roof tiles. A respective photovoltaic roof tile can include a glass front cover, a back cover that includes glass of photovoltaic backsheet, and a plurality of photovoltaic structures encapsulated between the glass front cover and the back cover by an encapsulant. The photovoltaic roof tile can be configured to function as a roof tile when placed on a rooftop of a building, thereby protecting the building from weather elements.

In a variation on this embodiment, a respective photovoltaic structure can include a first edge busbar positioned near an edge of a first surface and a second edge busbar positioned near an opposite edge of a second surface. The plurality of photovoltaic structures can be arranged in such a way that the first edge busbar of a first photovoltaic structure overlaps the second edge busbar of an adjacent photovoltaic structure, thereby forming a cascaded string.

In a further variation, the cascaded string within a first photovoltaic roof tile and the cascaded string within a second photovoltaic roof tile can be electrically coupled to each other in parallel.

In a further variation, the photovoltaic roof module can further include a metallic tab configured to couple corresponding edge busbars of the cascaded strings within the first and second photovoltaic roof tiles. The metallic tab can be coupled to a corresponding edge busbar via a strain-relief connector, which can include an elongated member and a plurality of laterally extended wires.

In a further variation, the strain-relief connector can be coupled to the corresponding edge busbar via electrically conductive adhesive.

In a variation on this embodiment, the photovoltaic roof module can further include a number of tile spacers. A respective tile spacer can be positioned between a first photovoltaic roof tile and an adjacent photovoltaic roof tile, mechanically coupling the first photovoltaic roof tile and the adjacent photovoltaic roof tile is a semi-rigid manner.

In a further variation, the tile spacer can include a ridge and two wings extending from the ridge in opposite directions. A respective wing of the tile spacer can be embedded within the encapsulant positioned between the glass front cover and the back cover of a corresponding photovoltaic roof tile.

In a further variation, the ridge can include a groove extending along a longitudinal axis of the ridge on a top surface, thereby creating a visual effect of a gap between the adjacent photovoltaic roof tiles. The ridge can further include a channel on a bottom surface configured to allow a metallic tab electrically coupling the adjacent photovoltaic roof tiles to pass through.

In a variation on this embodiment, the photovoltaic roof module can further include a junction box positioned on the back cover of a particular photovoltaic roof tile. The junction box can include a physical enclosure and an attachment pad extended substantially vertically out of a surface of the physical enclosure. The attachment pad can be configured to electrically access, via a through hole on the back cover, photovoltaic structures encapsulated within the particular photovoltaic roof tile.

In a further variation, the attachment pad can include an extension post for extending out of the junction box, a contact pad coupled to a first end of the extension post, and a wire coupler coupled to an opposite end of the extension post. The contact pad can be configured to be electrically and mechanically coupled to an electrode of the photovoltaic structures encapsulated within the particular photovoltaic roof tile, and the wire coupler can be configured to be electrically and mechanically coupled to a lead wire, with a portion of the lead wire extending out of the physical enclosure.

One embodiment can provide a method for fabricating a photovoltaic roof module. The method can include obtaining a plurality of cascaded strings of photovoltaic structures and encapsulating the cascaded strings of photovoltaic structures between front and back covers of a plurality of photovoltaic roof tiles. A respective cascaded string can be encapsulated between front and back covers of a respective photovoltaic roof tile, and the photovoltaic roof tile can be configured to function as a roof tile when placed on a rooftop of a building, thereby protecting the building from weather elements.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

FIG. 1 shows an exemplary configuration of PV roof tiles on a house.

FIG. 5A illustrates a serial connection between three adjacent cascaded photovoltaic strips, according to one embodiment.

FIG. 5B illustrates a side view of the string of cascaded strips, according to one embodiment.

FIG. 13A shows the bottom view of an exemplary multi-tile module, according to one embodiment of the present invention.

FIG. 13B shows the cross-sectional view along cut plane B-B', according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the disclosed system solve the technical problem of packaging solar cells or photovoltaic structures into photovoltaic roof tiles and tile modules. In some embodiments, a photovoltaic roof tile can include a plurality of photovoltaic strips, which can be obtained by dividing conventional square or pseudo-square solar cells into multiple pieces, encapsulated between a front cover and a back cover. The photovoltaic strips within each photovoltaic roof tile can form a serially connected string. Multiple photovoltaic roof tiles can be electrically coupled in parallel and bonded by inter-tile spacers to form a multi-tile module. The inter-tile spacer facilitates and protects electrical coupling between adjacent roof tiles within a multi-tile module. A multi-tile module can also include junction boxes that facilitate inter-module electrical interconnections.

Solar Roof Tiles and Tile Modules

A PV roof tile (or solar roof tile) is a type of PV module shaped like a roof tile and typically enclosing fewer solar cells than a conventional solar panel. Note that such PV roof tiles can function as both PV cells and roof tiles at the same time. FIG. 1 shows an exemplary configuration of PV roof tiles on a house. PV roof tiles 100 can be installed on a house like conventional roof tiles or shingles. Particularly, a PV roof tile can be placed on the rooftop of a building with other tiles in such a way as to protect the building from various weather elements, such as preventing water from entering the building.

A PV roof tile can enclose multiple solar cells or PV structures, and a respective PV structure can include one or more electrodes such as busbars and finger lines. The PV structures within a PV roof tile can be electrically and optionally mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2A:
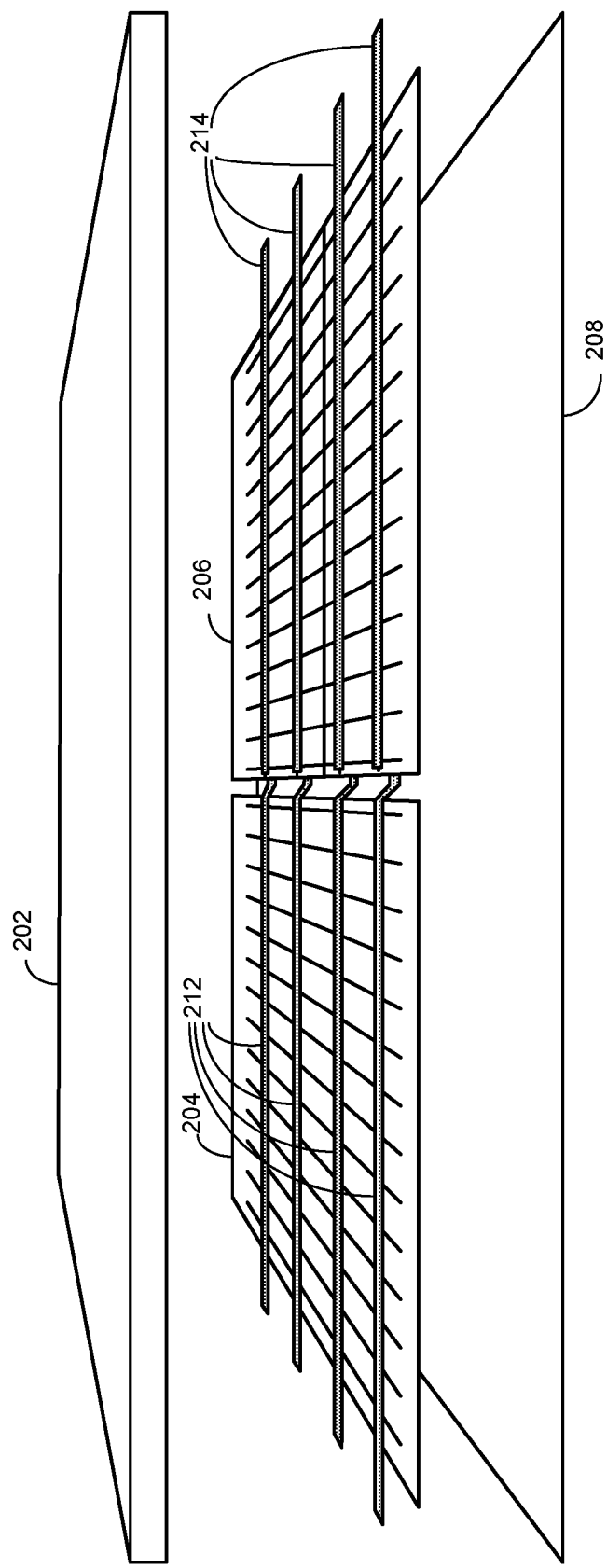
FIG. 2A shows the perspective view of an exemplary photovoltaic roof tile, according to an embodiment.

FIG. 2A shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2A, metallic tabbing strips 212 can be in contact with the front-side electrodes (e.g., the busbars) of solar cell 204 and extend beyond the left edge of glass 202, thereby serving as contact electrodes of a first polarity of the PV roof tile. Tabbing strips 212 can also be in contact with the back side of solar cell 206, creating a serial connection between solar cell 204 and solar cell 206. On the other hand, tabbing strips 214 can be in contact with front-side electrodes of solar cell 206 and extend beyond the right edge of glass cover 202, serving as contact electrodes of a second polarity of the PV roof tile.

Figure 2B:
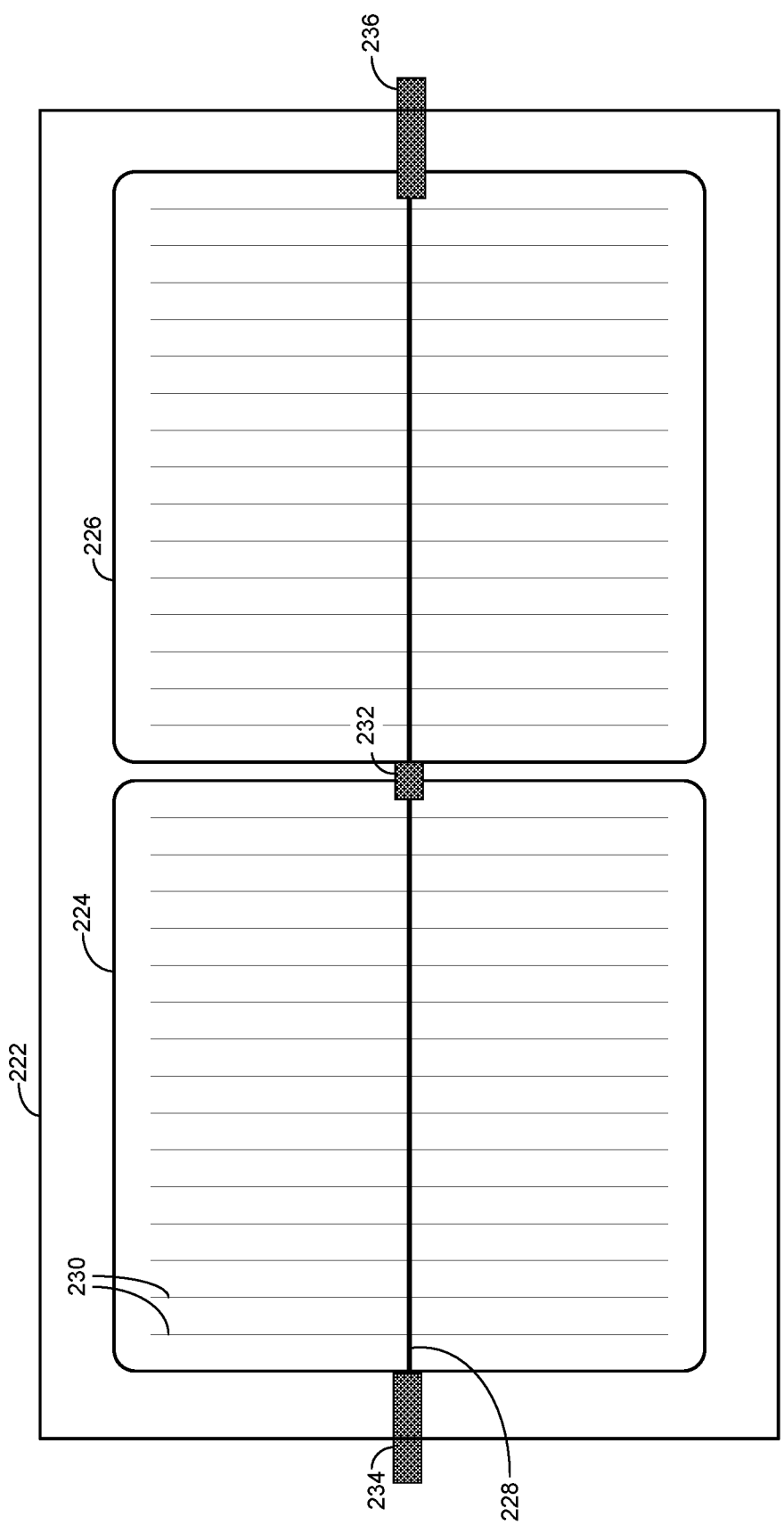
FIG. 2B shows a top view of an exemplary photovoltaic roof tile, according to one embodiment.

In the example shown in FIG. 2A, each solar cell has four busbars and four metallic tabbing strips are used to connect the solar cells in series. It is also possible to reduce the number of busbars and tabbing strips in order to reduce shading. Moreover, instead of using long tabbing strips to substantially cover the surfaces of the busbars, it is also possible to use short metal tabs for electrical coupling between adjacent solar cells. FIG. 2B shows a top view of an exemplary photovoltaic roof tile, according to one embodiment. In FIG. 2B, solar cells 224 and 226 can be sealed between transparent top glass cover 222 and a backsheet (not shown in FIG. 2B). Ideally, top glass cover 222 and the backsheet can create a hermetical seal protecting the solar cells from the weather elements. A respective solar cell can have a single busbar and a number of finger lines. For example, solar cell 224 can have single busbar 228 and finger lines 230. Solar cells 224 and 226 can be electrically coupled by tab 232, via their respective busbars, to create an in-series electrical connection. More specifically, tab 232 can connect the front single busbar (i.e., busbar 228) of solar cell 224 to the back side electrode of solar cell 226. In addition, tabs 234 and 236 can be used to provide external connection to the back side electrode of solar cell 224 and front side electrode (i.e., the single busbar) of solar cell 226. Note that the back side electrode of a solar cell can include a single busbar or an Al layer covering the entire back side of the solar cell.

Figure 3:
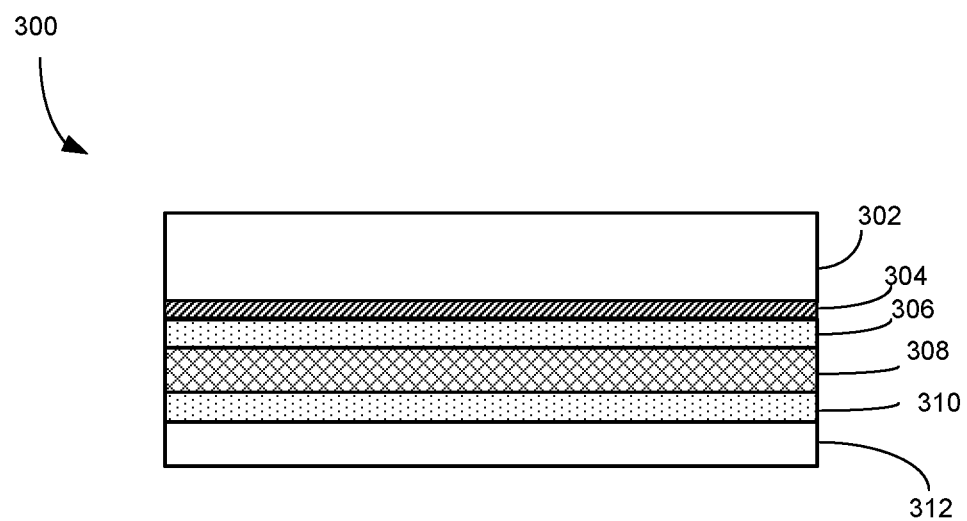
FIG. 3 shows a cross-section of an exemplary photovoltaic roof tile, according to an embodiment.

FIG. 3 shows a cross-section of an exemplary photovoltaic roof tile, according to an embodiment. Solar cell or array of solar cells 308 can be encapsulated between top glass cover 302 and back cover 312, which can be fortified glass or a regular PV backsheet. Top encapsulant layer 306, which can be based on a polymer, can be used to seal top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal array of solar cells 308 and back cover 312. A PV roof tile can also contain other optional layers, such as an optical filter or coating layer or a layer of nanoparticles for providing desired color appearances. In the example shown in FIG. 3, module or roof tile 300 also contains an optical filter layer 304.

Figure 4A:
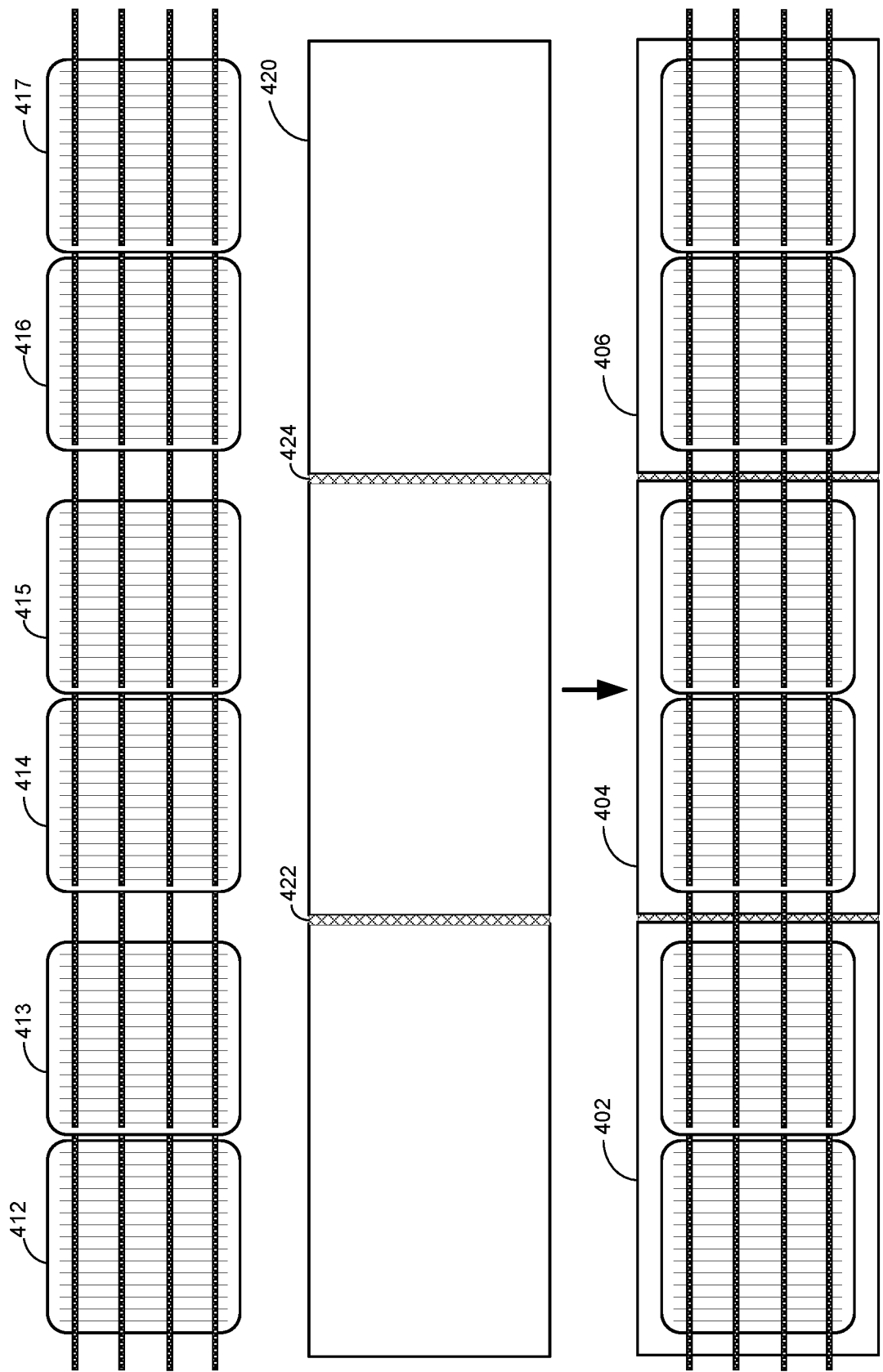
FIG. 4A illustrates an exemplary configuration of a multi-tile module, according to one embodiment.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common backsheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity in roof installation, because the tiles within the module have been connected with the tabbing strips. Note that the numbers of tiles included in each multi-tile module can be more or fewer than what is shown in FIG. 4A.

Figure 4B:
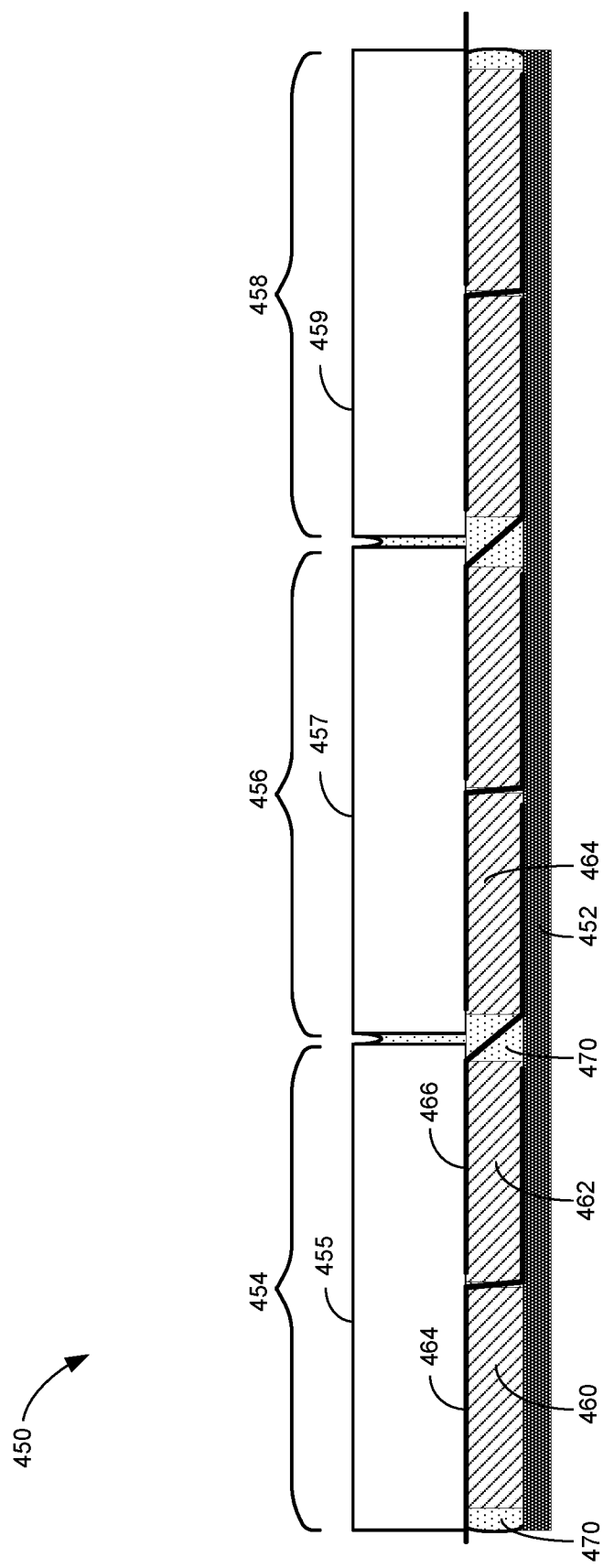
FIG. 4B illustrates a cross-section of an exemplary multi-tile module, according to one embodiment.

FIG. 4B illustrates a cross-section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells. For example, tile 454 can include solar cells 460 and 462 encapsulated between backsheet 452 and glass cover 455. Tabbing strips can be used to provide electrical coupling within each tile and between adjacent tiles. For example, tabbing strip 464 can couple the front electrode of solar cell 460 to the back electrode of solar cell 462, creating a serial connection between these two cells. Similarly, tabbing strip 466 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 466 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles. In some embodiments, each PV roof tile can have its own front cover and back sheet, and adjacent PV roof tiles can be joined by a semi-rigid reinforcement spacer.

In addition to the examples shown in FIGS. 4A and 4B, a PV tile may include different forms of photovoltaic structures. For example, in order to reduce internal resistance, each square solar cell shown in FIG. 4A can be divided into multiple (e.g., three) smaller strips, each having edge busbars of different polarities on its two opposite edges. The edge busbars allow the strips to be cascaded one by one to form a serially connected string.

FIG. 5A illustrates a serial connection between three adjacent cascaded photovoltaic strips, according to one embodiment. In FIG. 5A, strips 502, 504, and 506 are stacked in such a way that strip 504 partially overlaps adjacent strip 506 to its right, and strip 502 to its left. The resulting string of strips forms a cascaded pattern similar to roof shingles. Strips 502 and 504 are electrically coupled in series via edge busbar 508 at the top surface of strip 502 and edge busbar 510 at the bottom surface of strip 504. Strips 502 and 504 can be arranged in such a way that bottom edge busbar 510 is above and in direct contact with top edge busbar 508. The coupling between strips 504 and 506 can be similar.

FIG. 5B illustrates the side view of the string of cascaded strips, according to one embodiment. In the example shown in FIGS. 5A and 5B, the strips can be segments of a six-inch square or pseudo-square solar cell, with each strip having a dimension of approximately two inches by six inches. To reduce shading, the overlapping between adjacent strips should be kept as small as possible. Therefore, in the example shown in FIGS. 5A and 5B, the single busbars (both at the top and the bottom surfaces) can be placed at or near the very edge of the strip. The same cascaded pattern can extend along multiple strips to form a string connected in series, and a number of strings can be coupled in series or parallel.

Figure 5C:
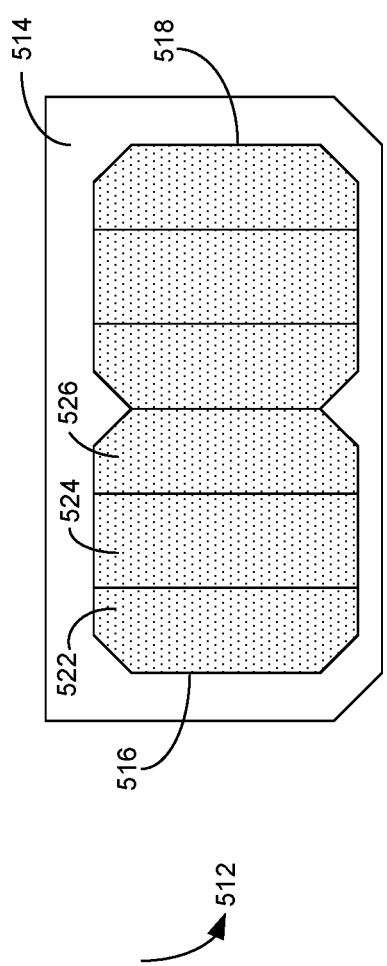
FIG. 5C illustrates a top view of an exemplary solar roof tile, according to one embodiment.

FIG. 5C illustrates a top view of an exemplary solar roof tile, according to one embodiment. A solar roof tile 512 includes top glass cover 514 and solar cells 516 and 518. The bottom cover (e.g., backsheet) of solar roof tile 512 is out of view in FIG. 5C. Solar cells 516 and 518 can be conventional square or pseudo-square solar cells, such as six-inch solar cells. In some embodiments, solar cells 516 and 518 can each be divided into three separate pieces of similar size. For example, solar cell 516 can include strips 522, 524, and 526. These strips can be arranged in such a way that adjacent strips are partially overlapped at the edges, similar to the ones shown in FIGS. 5A-5B. For simplicity of illustration, the electrode grids, including the finger lines and edge busbars, of the strips are not shown in FIG. 5C. In addition to the example shown in FIG. 5C, a solar roof tile can contain fewer or more cascaded strips, which can be of various shapes and size.

Figure 6:
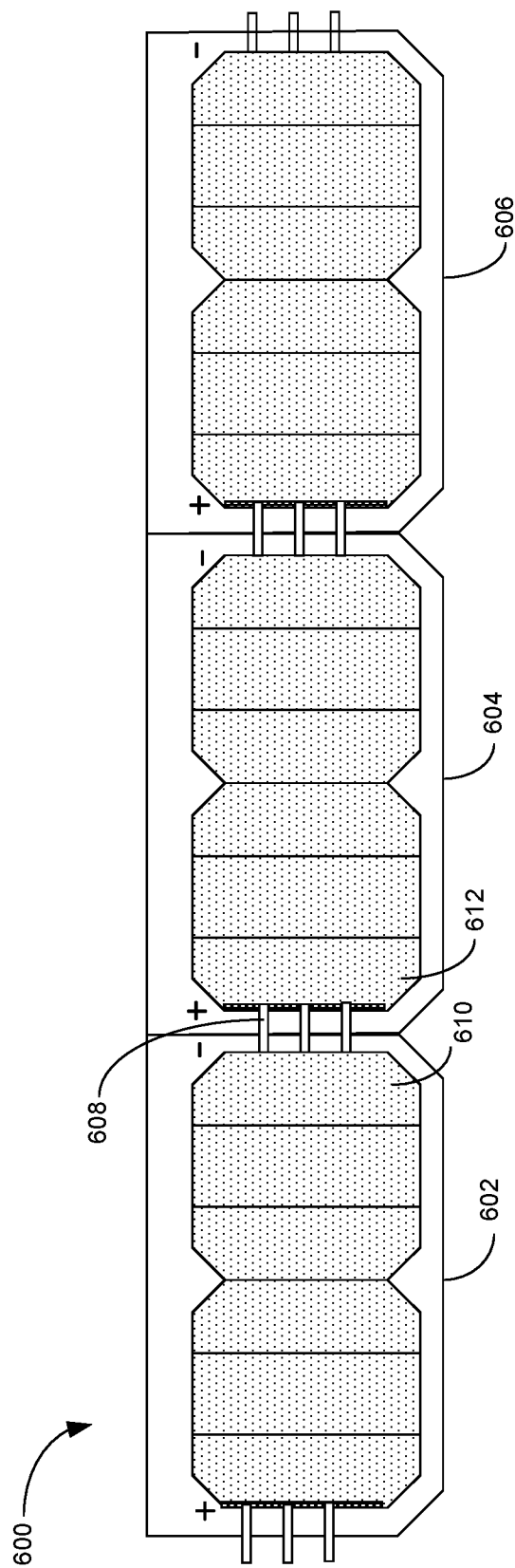
FIG. 6 shows a top view of an exemplary multi-tile module, according to one embodiment.

When multiple tiles are pre-assembled to form a multi-tile module, inter-tile electrical coupling needs to be established within the multi-tile module. One straightforward solution is to connect the tiles in series. FIG. 6 shows the top view of an exemplary multi-tile module, according to one embodiment. Multi-tile PV module 600 can include PV roof tiles 602, 604, and 606 arranged side by side. Each PV roof tile can include six cascaded strips encapsulated between the front and back covers. The cascaded strips within each PV roof tile form a serially connected string. Furthermore, metal tabs can be used to couple the strings enclosed in adjacent tiles in series by connecting the negative polarity of a string to the positive polarity of an adjacent string. For example, metal tab 608 can couple the edge busbar on the front side of strip 612 with the edge busbar on the back side of strip 610, creating a serial coupling between strips 610 and 612 and between the string within tile 602 and the string within tile 604. Although the example in FIG. 6 shows three metal tabs interconnecting the photovoltaic strips, other numbers of metal tabs can also be used. Furthermore, other coupling mechanisms, such as a single wide metallic tab overlapping the adjacent edge busbars of the adjacent tiles, can also be used to couple the tiles in series.

Figure 7:
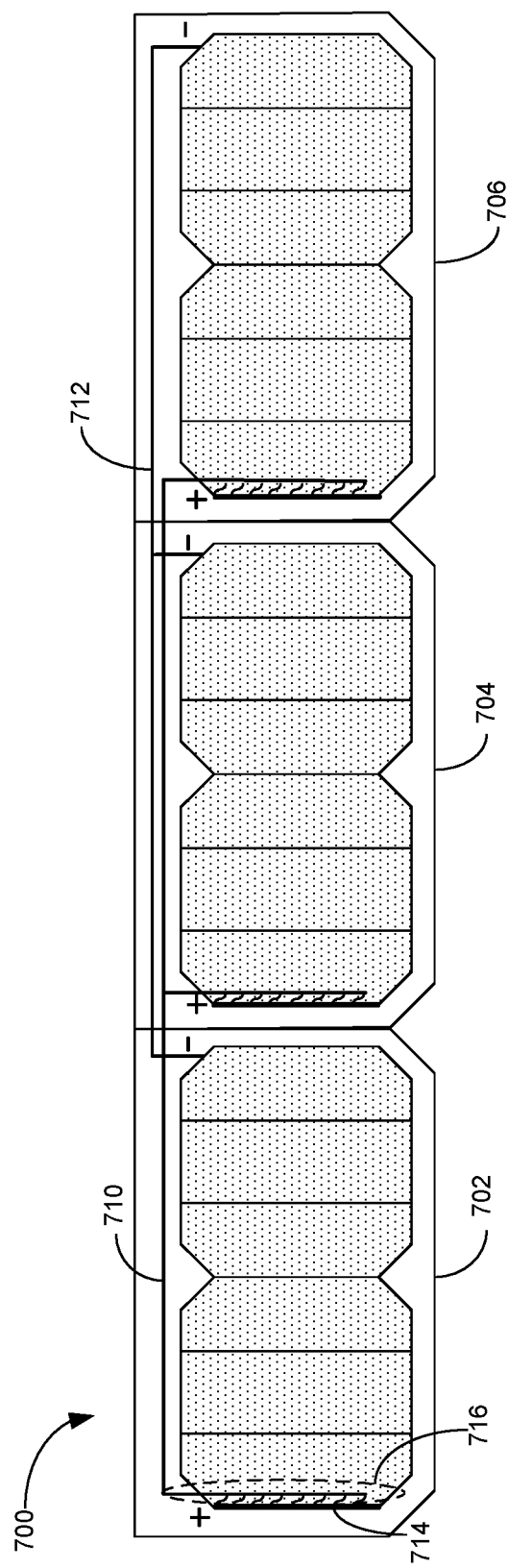
FIG. 7 shows the inter-tile coupling within an exemplary multi-tile module, according to one embodiment.

In some embodiments, the tiles within the multi-tile module are coupled to each other in parallel. FIG. 7 shows the inter-tile coupling within an exemplary multi-tile module, according to one embodiment. Multi-tile PV module 700 can include solar roof tiles 702, 704, and 706 arranged side by side. Solar roof tiles 702, 704, and 706 can be similar to solar roof tile 512 shown in FIG. 5C. Each solar roof tile can include six cascaded strips encapsulated between the front and back covers, meaning that busbars located at opposite edges of the cascaded string of strips have opposite polarities. For example, if the leftmost edge busbar of the strips in solar roof tile 702 has a positive polarity, then the rightmost edge busbar of the strips will have a negative polarity. In-parallel connections can be established among the tiles by electrically coupling busbars having the same polarity.

In the example shown in FIG. 7, the solar roof tiles are arranged in such a way that their sun-facing sides have the same electrical polarity. As a result, the edge busbars of the same polarity will be on the same left or right edge. For example, the leftmost edge busbar of all solar roof tiles can have a positive polarity and the rightmost edge busbar of all solar roof tiles can have a negative polarity, or vice versa. In FIG. 7, the left edge busbars of all strips have a positive polarity (indicated by the "+" signs) and are located on the sun-facing (or front) surface of the strips, whereas the right edge busbars of all strips have a negative polarity (indicated by the "−" signs) and are located on the back surface. Depending on the design of the layer structure of the solar cell, the polarity and location of the edge busbars can be different from those shown in FIG. 7.

In-parallel connections among the tiles can be formed by electrically coupling all leftmost busbars together via metal tab 710 and all rightmost busbars together via metal tab 712. Metal tabs 710 and 712 are also known as connection buses and typically can be used for interconnecting individual solar cells or strings. A metal tab can be stamped, cut, or otherwise formed from conductive material, such as copper.

Copper is a highly conductive and relatively low-cost connector material. However, other conductive materials such as silver, gold, or aluminum can be used. In particular, silver or gold can be used as a coating material to prevent oxidation of copper or aluminum. In some embodiments, alloys that have been heat-treated to have super-elastic properties can be used for all or part of the metal tab. Suitable alloys may include, for example, copper-zinc-aluminum (CuZnAl), copper-aluminum-nickel (CuAlNi), or copper-aluminum-beryllium (CuAlBe). In addition, the material of the metal tabs disclosed herein can be manipulated in whole or in part to alter mechanical properties. For example, all or part of metal tabs 710 and 712 can be forged (e.g., to increase strength), annealed (e.g., to increase ductility), and/or tempered (e.g. to increase surface hardness).

The coupling between a metal tab and a busbar can be facilitated by a specially designed strain-relief connector. In FIG. 7, strain-relief connector 716 can be used to couple busbar 714 and metal tab 710. Such strain-relief connectors are needed due to the mismatch of the thermal expansion coefficients between metal (e.g., Cu) and silicon. More particularly, metal tends to expand or contract more than Si-based photovoltaic strips when the solar roof tile is heated or cooled, thus initiating shear forces at bonded joints between the metal tabs and the photovoltaic strips. Specially designed strain-relief connectors can help alleviate destructive thermal expansion and contraction effects in the solar roof tiles.

As shown in FIG. 7, the metal tabs (e.g., tabs 710 and 712) may cross paths with strain-relief connectors of opposite polarities. To prevent an electrical short of the photovoltaic strips, portions of the metal tabs and/or strain-relief connectors can be coated with an insulation film or wrapped with a sheet of insulation material.

Figure 8C:
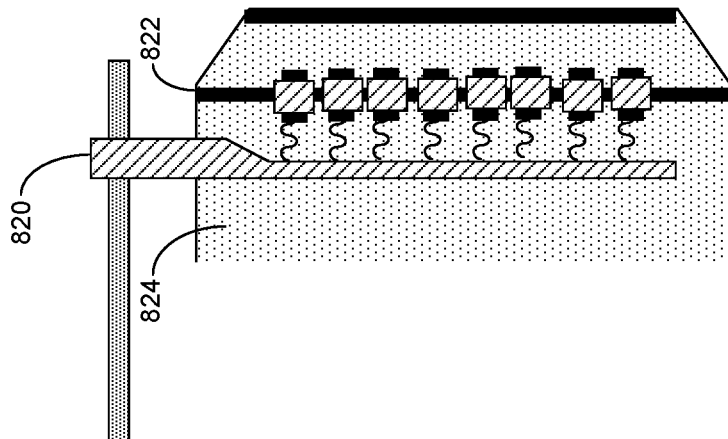
FIG. 8C illustrates the coupling between a strain-relief connector and the back side of a photovoltaic structure, according to one embodiment.
Figure 8B:
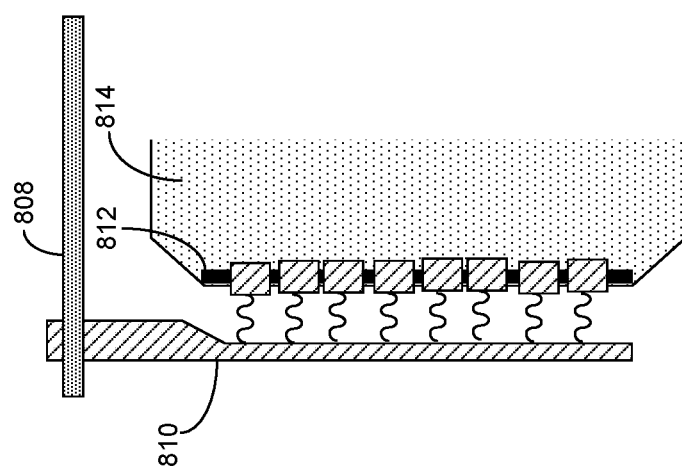
FIG. 8B illustrates the coupling between a strain-relief connector and the front side of a photovoltaic structure, according to one embodiment.
Figure 8A:
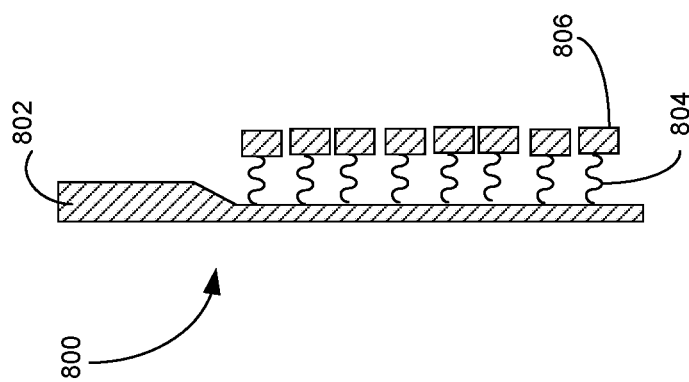
FIG. 8A shows a detailed view of an exemplary strain-relief connector, according to one embodiment.

FIG. 8A shows a detailed view of an exemplary strain-relief connector, according to one embodiment. In FIG. 8A, strain-relief connector 800 can include elongated connection member 802, a number of curved metal wires (e.g., curved metal wire 804), and a number of connection pads (e.g., connection pad 806). Elongated connection member 802 can extend along a direction substantially parallel to the to-be-coupled busbar of a photovoltaic structure. The curved metal wires can extend laterally from elongated connection member 802 in a non-linear manner (i.e., having non-linear geometry). Non-linear geometry can include paths that centrally follow a curved wire (e.g., a path that extends along a series of centermost points located between outermost edges) or along any face or edge of the wire. A curved wire having non-linear geometry can have, but does not require, symmetry along the path of elongation. For example, one edge, or portion of an edge, of a curved wire can be straight and an opposite edge can include one or more curves, cuts, or extensions. Curved wires having non-linear geometry can include straight portions before, after, and/or between non-linear portions. Non-linear geometry can include propagating paths that extend laterally along a first axis (e.g., X axis) while alternating direction in negative and positive directions of one or more other axes (e.g., Y axis and/or Z axis) that are perpendicular to the first axis, in a repetitive manner, such as a sine wave or helix. While the curved wires disclosed herein use curved profiles, non-linear geometry can be constructed from a series of straight lines; for example, propagating shapes, such as square or sawtooth waves, can form non-linear geometry. These curved wires can relieve the strain generated due to the mismatch of thermal expansion coefficients between the metal connector and the Si-based photovoltaic structure.

In some embodiments, each curved metal wire can be attached to a connection pad. For example, curved metal wire 804 can be attached to connection pad 806. In alternative embodiments, more than one (e.g., two or three) curved wires can be attached to a connection pad. The elongated connection member 802, the curved wires, and the connection pads can be formed (e.g., stamped or cut) from a single piece of material, or they can be attached to each other by any suitable electrical connection, such as by soldering, welding, or bonding.

FIG. 8B illustrates the coupling between a strain-relief connector and the front side of a photovoltaic structure, according to one embodiment. More specifically, strain-relief connector 810 is coupled to edge busbar 812 of photovoltaic structure 814 by overlapping its connection pads with the front side of edge busbar 812. FIG. 8B also shows the coupling between strain-relief connector 810 and metal tab 808. More specifically, strain-relief connector 810 can be in direct contact with metal tab 808, and the metal-to-metal contact can create an electrical coupling. In some embodiments, electrically conductive adhesive (ECA) can be applied to electrically and mechanically couple strain-relief connector 810 and metal tab 808. Metal tab 808 can be similar to metal tab 710 or 712 shown in FIG. 7 and can be used to couple one solar tile to an adjacent solar tile.

FIG. 8C illustrates the coupling between a strain-relief connector and the back side of a photovoltaic structure, according to one embodiment. More specifically, strain-relief connector 820 can be coupled to busbar 822 of photovoltaic structure 824 by overlapping its connection pads with contact pads belonging to busbar 822. ECA can also be applied to create an electrical and mechanical bond. Note that, unlike the front side, the back side of a photovoltaic structure can include additional busbars because there is no need to worry about shading on the back side. To facilitate better adhesion and electrical access, the additional busbars on the back side of the PV structure can also include widened regions, known as contact pads. Detailed descriptions of such contact pads can be found in U.S. patent application Ser. No. 14/831,767, filed Aug. 20, 2015, and entitled "Photovoltaic Electrode Design with Contact Pads for Cascaded Application," the disclosure of which is incorporated herein by reference in its entirety.

Inter-Tile Spacers

In the example shown in FIGS. 4A-4B, the gaps between adjacent tiles can be filled with encapsulant to form a semi-rigid joint between the adjacent tiles. However, there remain several problems with the semi-rigid construction of multi-tile modules. Particularly, the inter-tile gap filled with encapsulant may be a structurally weak spot, providing insufficient flexibility and strength for reliable long-term usage. In addition, it can be difficult to deposit the encapsulant material precisely at the gaps. For example, encapsulant may overflow the gap during the lamination process, and be difficult to clean. Aesthetically, the encapsulant-filled gap can be ungainly, and appear noticeably different from standard roof tiles. Finally, weather elements such as rain and solar radiation can damage PV components, especially if there are exposed electrical connections.

Figure 9:
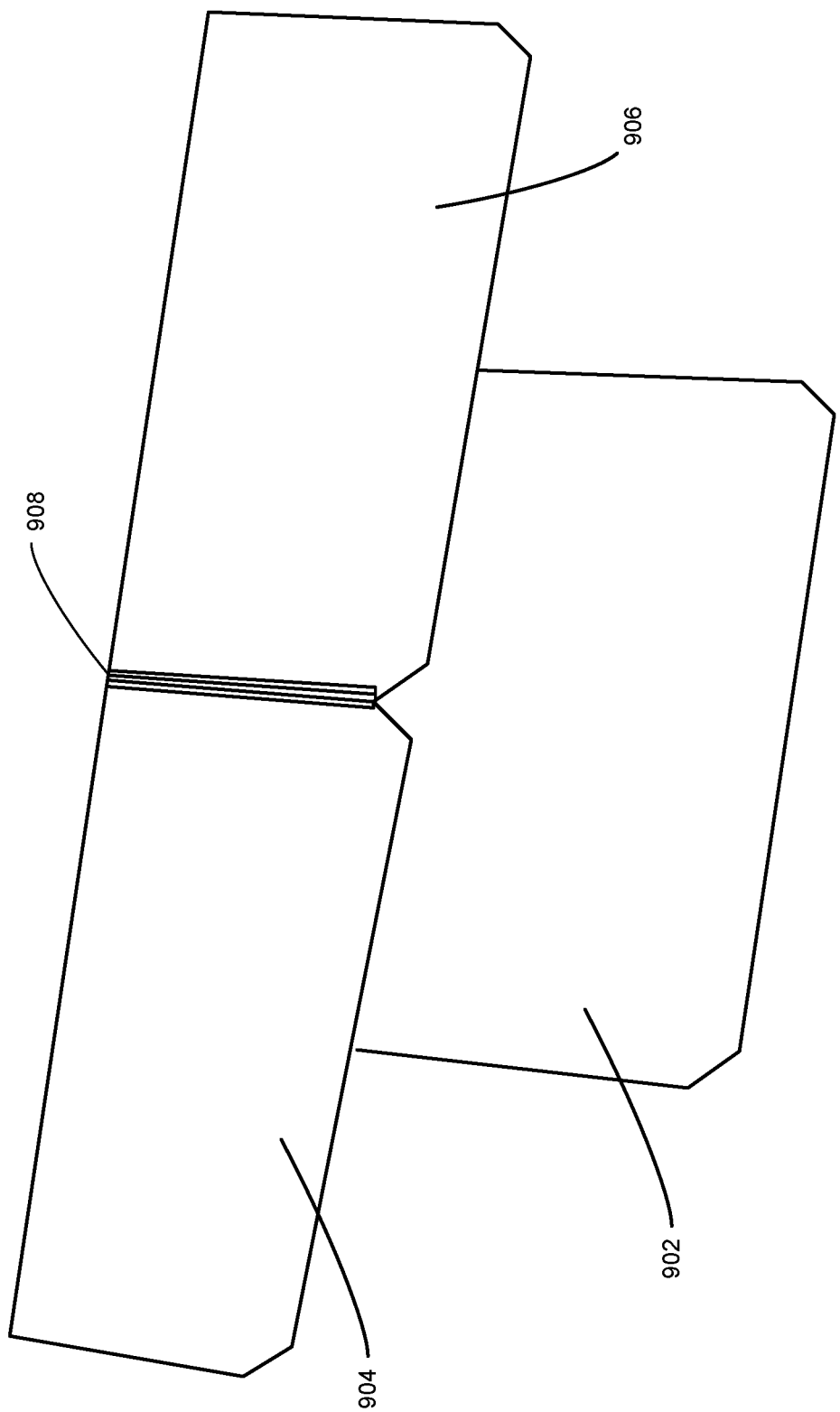
FIG. 9 illustrates multiple photovoltaic roof tiles installed in an overlapping configuration, according to an embodiment.

Some embodiments can solve these problems by providing a reinforcement spacer to enhance flexibility and mechanical stability of a multi-tile module. In addition, the reinforcement spacer can protect inter-tile electrical bussing and direct/control the flow of encapsulant during lamination. FIG. 9 illustrates multiple photovoltaic roof tiles installed in an overlapping configuration, according to an embodiment. In FIG. 9, PV roof tiles 904 and 906 are coupled side-by-side by reinforcement spacer 908. PV roof tiles 904 and 906 overlap with PV roof tile 902 in an offset manner such that the gap between tiles 904 and 906, and therefore reinforcement spacer 908, are somewhat aligned to the center of PV roof tile 902. This arrangement can prevent possible water leakage through the gap between tiles 904 and 906.

Figure 10A:
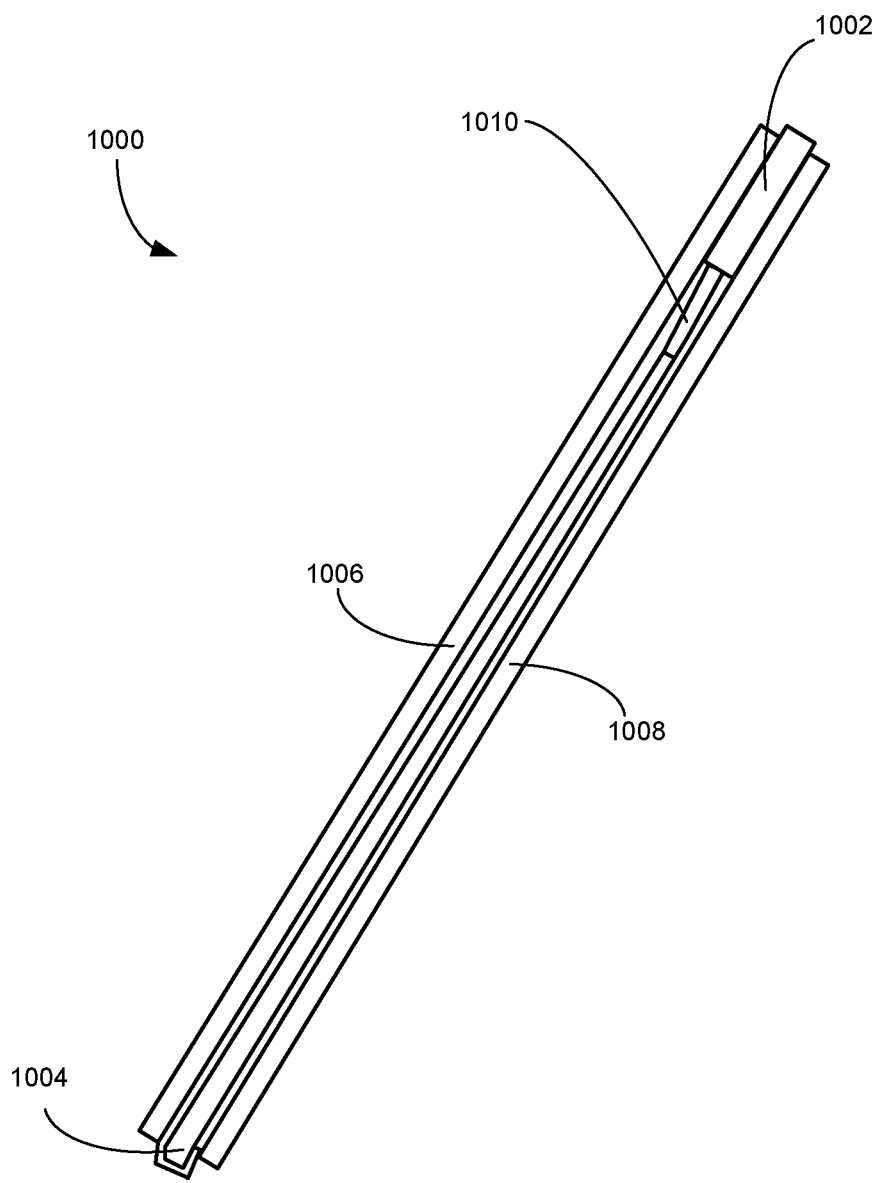
FIG. 10A illustrates a perspective view of an exemplary reinforcement spacer, according to an embodiment.

FIG. 10A illustrates a perspective view of an exemplary reinforcement spacer, according to an embodiment. A spacer can be designed to fit between two adjacent PV roof tiles in a multi-tile module, as shown in FIG. 9. In FIG. 10A, spacer 1000 includes a main body (can be referred to a base or base ridge) 1002 that can be inserted between the adjacent PV roof tiles. When in position, base 1002 can be arranged in such a way that its longitudinal axis is oriented parallel to the adjacent edges of the tiles. The thickness of base 1002 can be designed in such a way that, when in position, the top or sun-facing surface of base 1002 can be aligned with the surface of the top glass cover of the PV tiles, thus creating a seamless interface between base 1002 and the PV tiles. Base 1002 can include a groove 1004 on its top surface. Such a groove is essential in providing a visual appearance of a gap existing between the adjacent PV roof tiles. As discussed previously, the PV roof tiles are designed to mimic the appearance of traditional roof tiles. In the example shown in FIG. 10A, the cross-section of groove 1004 can shape U-shaped, with square corners. Alternatively, the cross-section of the groove can be U-shape, with round corners. Groove 1004 can also have other types of cross-section, such as a V-shape cross-section or a trapezoidal cross-section. The depth of groove 1004 can vary as long as it is sufficiently thick to be able to create the visual effect of a gap.

In some embodiments, instead of a groove, the visual effect of a "gap" can be created by a mark (e.g., a painted mark or a color variation) created on the top surface of base 1002. Such a mark can generally provide a neater or more attractive aesthetic appearance compared with an encapsulant-filled inter-tile gap.

Spacer 1000 can have two wings 1006 and 1008 attached to either side of base 1002. The position and thickness of each wing are designed in such a way that, when in position, the wings can be inserted into the adjacent roof tiles. More specifically, each wing can be inserted between the top glass cover and backsheet of a corresponding roof tile. Therefore, after lamination, each PV tile can be mechanically bound to a wing, thus creating a rigid or semi-rigid bonding between the two adjacent PV tiles. More specifically, a rigid spacer can provide a rigid bonding, whereas a somewhat flexible spacer can provide a somewhat flexible or semi-rigid bonding. In practice, it can be desirable for the inter-tile bonding to be somewhat flexible in order to accommodate certain conditions, such as windy days.

In the example shown in FIG. 10A, the wings can be rectangular and extend perpendicularly from the walls of groove 1004. Other shapes are possible. For example, the wings may have a tapered thickness. The length of the wings can vary. Longer wings can provide a stronger bond and a greater flexibility. In particular, longer wings provide greater adhesion to the glass and backsheet, and can allow the spacer to bend at a greater angle without detaching from the roof tiles. However, longer wings can occupy too much tile space and may shrink more upon cooling after lamination, leaving "bubbles" or space unfilled by the lamination. In some embodiments, the length of the wings can be chosen to provide enough flexibility for bending by an angle of up to 5° or 10°. For example, the length of the wings can be at least 3 mm (e.g., between 3 and 5 mm). In some embodiments, the length of the wings can be between 10 mm and 20 mm. A spacer with 20 mm wings can allow adjacent PV roof tiles to be offset from each other by 90°. The thickness of the wings can also vary, as long as sufficient structure strength of spacer 1000 can be achieved, while allowing sufficient amount of encapsulant to flow between the wings and the front and back covers of the PV tiles.

Likewise, the choice of material is important to the strength, performance, and long-term reliability of spacer 1000. Because PV roof tiles are exposed to the sun and other weather elements (e.g., rain and snow), spacer 1000 needs to be made of material that is ultraviolet (UV)-resistant as well as waterproof. Moreover, because it can be in contact with the inter-tile electrical connections, spacer 1000 should be made of a material that is electrically insulating. The material also ideally can withstand the heating, cooling, and associated thermal expansion resulting from lamination. In particular, the material preferably will not thermally contract excessively when cooling after lamination. In an embodiment, spacer 1000 can be made from a polymer or thermoplastic material, such as polyvinylidene fluoride (PVDF). Note that other materials are possible (e.g., polytetrafluoroethylene (PTFE)). In alternative embodiments, spacer 1000 can be made of a soft material, such as silicone.

One important function provided by spacer 1000 is to protect the inter-tile electrical bussing against weather elements such as rain, wind, or dirt. Note that, when driven by wind, rainwater can travel upwards along a roof. Because the PV roof tiles are typically laid in a way such that one row of tiles offsets an adjacent row of tiles, as shown in FIGS. 1 and 9, ramp 1010 can be used at the top of spacer 1000 to prevent rainwater from getting under the tiles of the upper row or being accumulated within groove 1004.

Figure 10B:
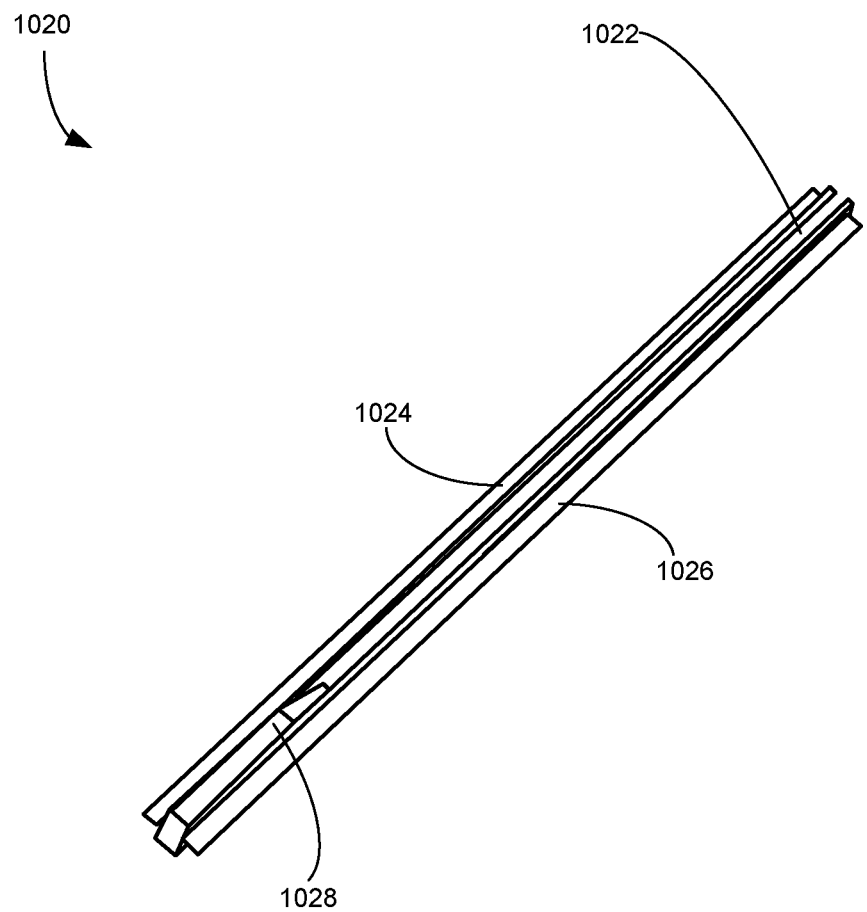
FIG. 10B illustrates an angled view of an exemplary reinforcement spacer, according to an embodiment.

FIG. 10B illustrates an angled view of an exemplary reinforcement spacer, according to an embodiment. In this example, spacer 1020 can include top groove 1022, wings 1024 and 1026, and ramp 1028. As shown, ramp 1028 can include an inclined portion rising from the bottom of groove 1022 to a flat plateau, which can be level with the top of the walls of groove 1022.

Figure 10C:
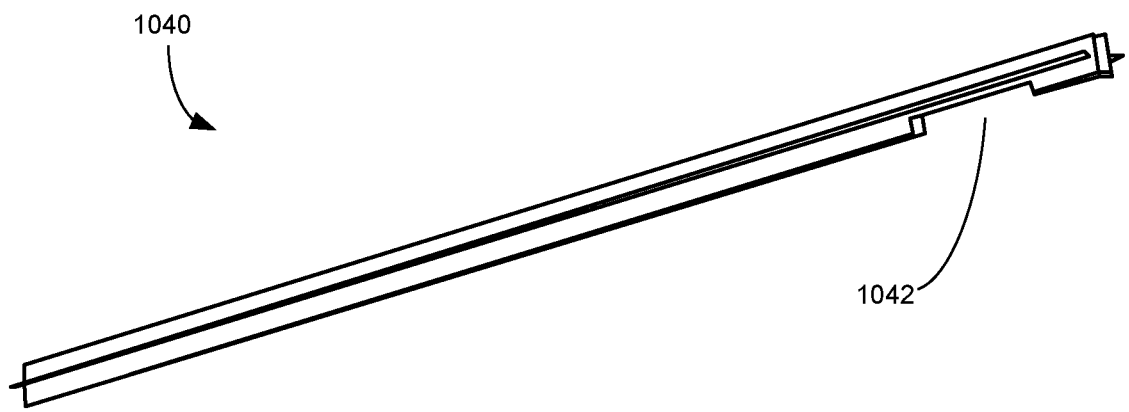
FIG. 10C illustrates another view of an exemplary reinforcement spacer, according to an embodiment.

FIG. 10C illustrates another view of an exemplary reinforcement spacer, according to an embodiment. More specifically, this view reveals the bottom half of the base of the spacer. In this example, the base of spacer 1040 can include a recessed space or bottom channel 1042 configured to allow electrical connecting mechanisms (e.g., bussing wires, ribbons, metal foil, or tabbing strips) to cross the inter-tile gap. Bottom channel 1042 can be positioned opposite to the spacer's ramp, e.g. opposite to ramp 1028 shown in FIG. 10B.

Figure 10D:
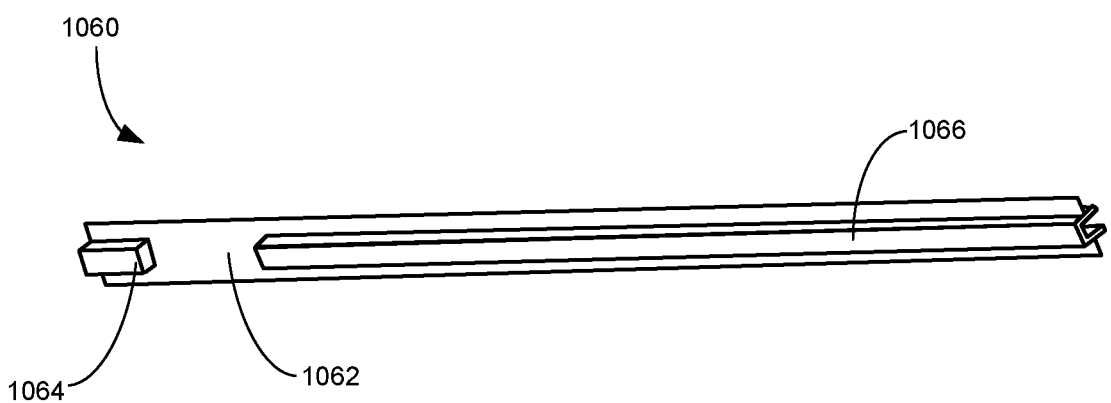
FIG. 10D illustrates one more view of an exemplary reinforcement spacer, according to an embodiment.

FIG. 10D illustrates one more view of an exemplary reinforcement spacer, according to an embodiment. In FIG. 10D, the bottom half of the spacer is shown with more details. More specifically, FIG. 10D shows that the bottom half of the base of spacer 1060 can include a bottom channel 1062 and a bottom anchoring panel 1064, which can anchor spacer 1060 between the two adjacent PV tiles. The remaining section of the base bottom is, in fact, the lower side walls and bottom wall of groove 1066. In some embodiments, the side walls and bottom surface of anchoring panel 1064 can be aligned to the outer side walls and bottom surface, respectively, of groove 1066.

The channel at the bottom side of the spacer base can be essential in facilitating inter-tile electrical connections. More specifically, tabbing strips (e.g., metallic tabs 710 and 712 shown in FIG. 7) can cross the spacer via the channel from one tile to an adjacent tile. The length of the channel can be determined based on the need of the electrical routing. Depending on the width and/or number of metallic tabs used for the inter-tile electrical coupling, the channel can be designed to be wider or narrower to accommodate the passing of such metallic tabs.

Figure 11B:
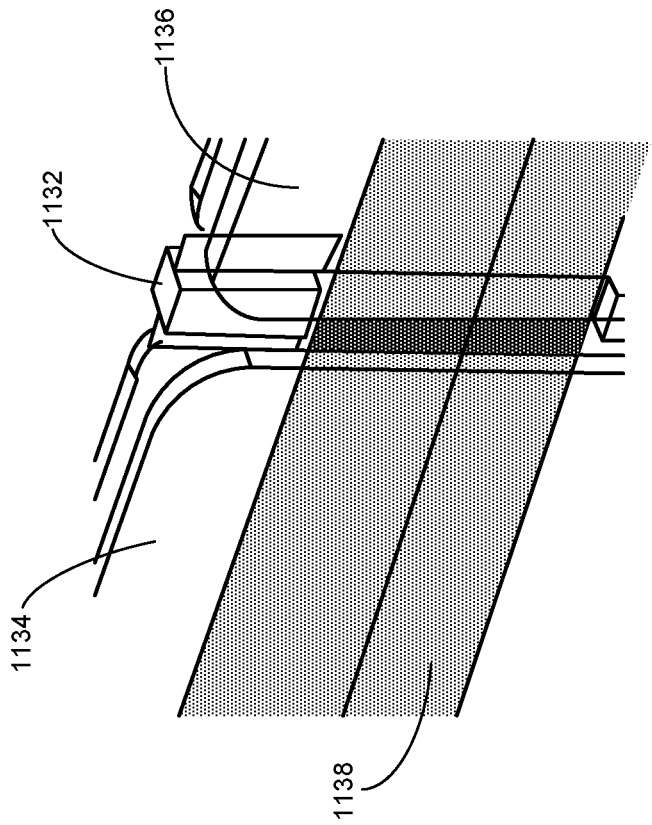
FIG. 11B illustrates a bottom view of a reinforcement spacer positioned between two adjacent photovoltaic roof tiles, according to an embodiment.
Figure 11A:
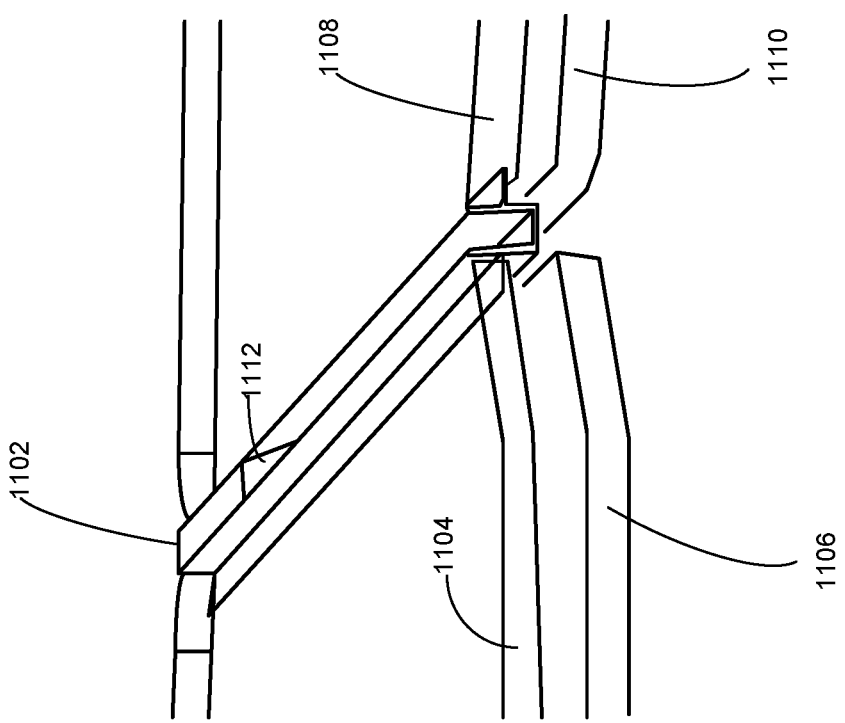
FIG. 11A shows an exemplary reinforcement spacer positioned between two adjacent photovoltaic roof tiles, according to an embodiment.

FIG. 11A shows an exemplary reinforcement spacer positioned between two adjacent photovoltaic roof tiles, according to an embodiment. This view shows a perspective from above the roof, i.e., the roof tiles' glass covers 1104 and 1108 face upward. In FIG. 11A, spacer 1102 is positioned between glass covers 1104 and 1108 of two adjacent PV roof tiles, and can be oriented in such a way that, when installed on a roof, ramp 1112 is positioned at the upper edge of the roof tiles closest to the roof's apex, i.e., ramp 1112 is at the highest end of the spacer. As shown, the left wing of spacer 1102 can be inserted between glass cover 1104 and backsheet 1106 of the left PV tile, and the right wing can be inserted between glass cover 1108 and backsheet 1110 of the right roof tile. For purposes of illustration, a space is drawn between a glass cover and a corresponding backsheet. In practice, after lamination, the glass cover and the corresponding backsheet can be bonded by encapsulant, which can also bind the wings of spacer 1102 to the corresponding glass cover and backsheet. For example, the left wing of spacer 1102 can be bonded, by cured encapsulant, to glass cover 1104 and backsheet 1106, and the right wing of spacer 1102 can be bonded to glass cover 1108 and backsheet 1110. Note that, in some embodiments, two or more adjacent roof tiles can share a common backsheet, i.e., backsheets 1106 and 1110 can be joined together. In this case, the spacer's wings can be inserted between the respective glass covers and the common backsheet of the two adjacent PV roof tiles. The strong adhesion between the spacer's wings and the glass cover/backsheet can provide the strength to the entire multi-tile assembly to allow the multi-tile assembly to be handled as a single piece. However, severe bending between the tiles may result in the failing of the adhesion, and thus, the failing of the multi-tile assembly.

FIG. 11B illustrates a bottom view of a reinforcement spacer positioned between two adjacent photovoltaic roof tiles, according to an embodiment. As shown, electrical connections such as metallic tab or tabs 1138 can extend across the bottom channel of spacer 1132, electrically coupling roof tiles 1134 and 1136. In addition to metallic tabs, other types of electrically coupling mechanisms (e.g., tabbing strips, foils, folded bussing, and "o" or "n" shaped bussing) can also be used to electrically couple two adjacent PV tiles. In various embodiments, the roof tiles can be electrically coupled in series or in parallel.

Note that, because the bottom of the spacer faces inward toward the building, and because electrical connections (e.g., metallic tabs) elsewhere have been protected by encapsulant, it is possible to leave the electrical connections uninsulated within the bottom channel of the spacer. Laminating the bottom side of the inter-tile gap with encapsulant can be technically challenging to achieve a consistent coated thickness. To further protect the metallic tabs, in some embodiments, the bottom channel of the spacer can be covered by an additional plastic (e.g., PVDF or PTFE) piece.

Figure 11C:
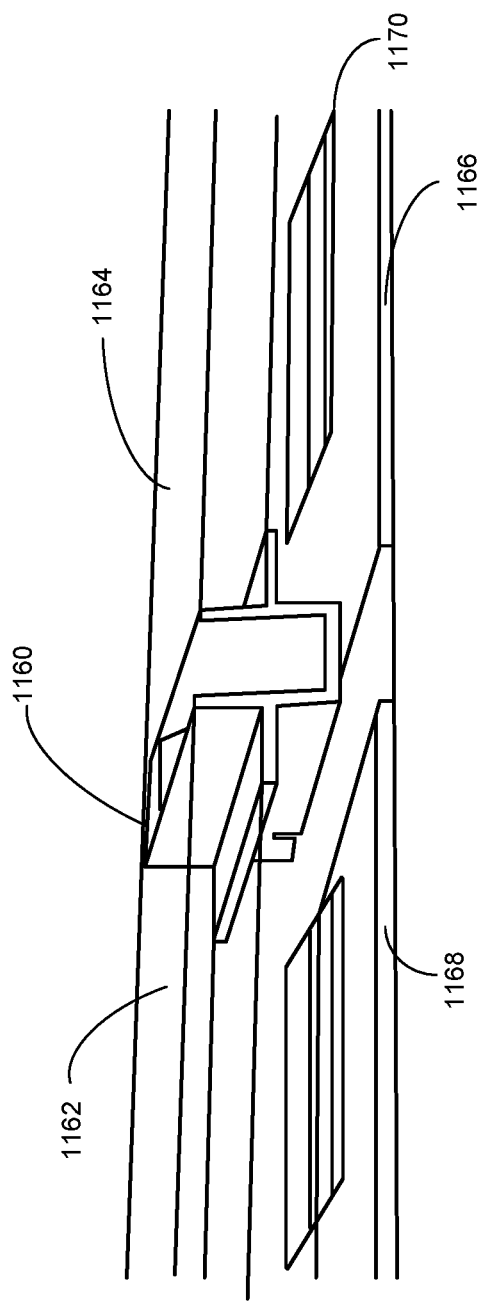
FIG. 11C illustrates a front view of a reinforcement spacer positioned between two adjacent photovoltaic roof tiles, according to an embodiment.

FIG. 11C illustrates a front view of a reinforcement spacer positioned between two adjacent photovoltaic roof tiles, according to an embodiment. The base of spacer 1160 can be inserted between front glass covers 1162 and 1164 belonging to two adjacent PV tiles. In the example shown in FIG. 11C, the outer sidewalls of spacer 1160 can be in direct contact with the edges of the two glass covers.

The top surface of spacer 1160 can be positioned in the same plane as the top surface of the front glass covers. In some embodiments, after lamination, the bottom surface of spacer 1160 can be aligned to the bottom surface of the backsheets. For illustration purposes, in FIG. 11C, backsheets 1166 and 1168 are shown to be separated from the spacer and top glass covers. In practice, after lamination, backsheets 1166 and 1168 can be attached to the wings of spacer 1160 as well as the corresponding front glass covers. In FIG. 11C, backsheets 1166 and 1168 are shown to be separate. However, in various embodiments, the multiple roof tiles in the module can share a common backsheet. FIG. 11C also shows the PV structures positioned between the glass cover and backsheet. For example, PV structure 1170 is shown to be between glass cover 1164 and backsheet 1166.

Figure 11D:
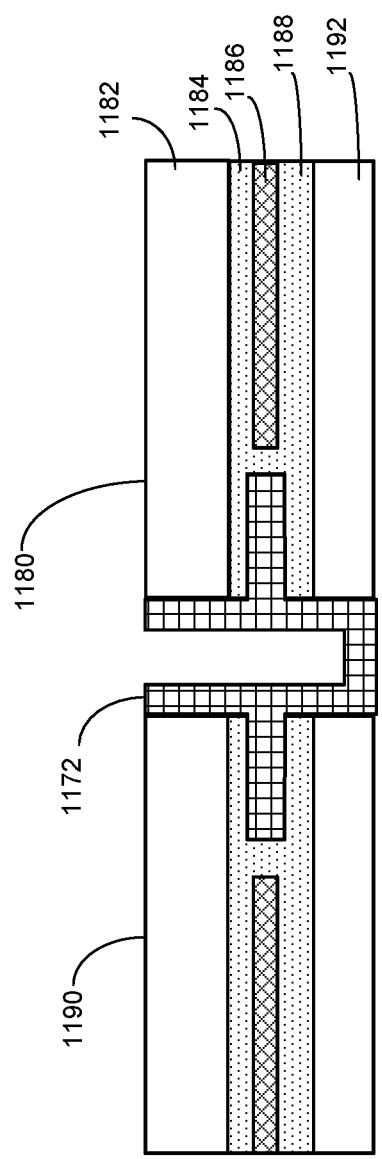
FIG. 11D illustrates a cross-sectional view of an exemplary spacer positioned between two adjacent roof tiles, according to an embodiment.

FIG. 11D illustrates a cross-sectional view of an exemplary spacer positioned between two adjacent roof tiles, according to an embodiment. In this example, PV roof tile 1180 can include top glass cover 1182, top encapsulant layer 1184, an array of PV structures 1186, bottom encapsulant layer 1188, and backsheet 1192. PV roof tile 1190 can have a structure similar to that of PV roof tile 1180. In FIG. 11D, spacer 1172 is inserted between PV roof tiles 1180 and 1190. More specifically, in the example shown in FIG. 11D, the wings of spacer 1170 can be inserted between top and bottom encapsulation layers of the PV tiles. For example, the right wing of spacer 1172 can be inserted between top encapsulation layer 1184 and bottom encapsulation layer 1188. Note that top glass cover 1182 and backsheet 1192 can extend beyond array of PV structures 1186 in order to provide space for the spacer's wings to be inserted into the encapsulant. This arrangement can prevent damage to the fragile PV structures by the spacer.

The width of the base of the spacer can be determined based on the dimension of the roof tiles. In some embodiments, the width of the base can be chosen to achieve a good aesthetic effect. For example, for PV roof tiles having a standard size, the width of the base of the spacer can be a few millimeters. There are no particular requirements for the thickness of the wings as long as they can be structurally strong and can allow a sufficient amount of encapsulant to flow between the wings and the front cover/backsheet. In some embodiments, the thickness of wings of the spacer can vary along its length (e.g., a taper can be introduced). Moreover, the surface of the wings can be textured to provide better adhesion between the wings and the encapsulant. Any space between the wings and top glass cover 1182/backsheet 1192 can be filled with encapsulant, particularly after lamination. The encapsulant material used to laminate the roof tiles, spacer, and/or inter-tile gaps can include PVB, TPO, EVA, TPD, or other materials. In the example shown in FIG. 11D, the top and bottom surfaces of spacer 1172 can be aligned to the top and bottom surface of the PV tiles. In practice, the bottom surface of spacer 1172 may be positioned above the bottom surface of the PV tiles. More specifically, if the backsheet in a multi-tile module is a continuous single sheet, the spacer can be positioned on top of the backsheet.

Figure 12A:
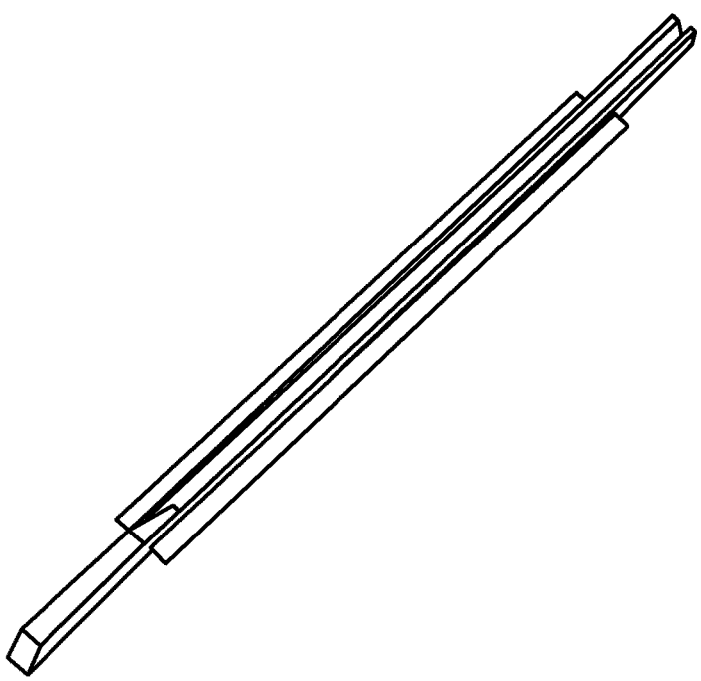
FIG. 12A illustrate a perspective view of an exemplary reinforcement spacer, according to an embodiment.
Figure 12B:
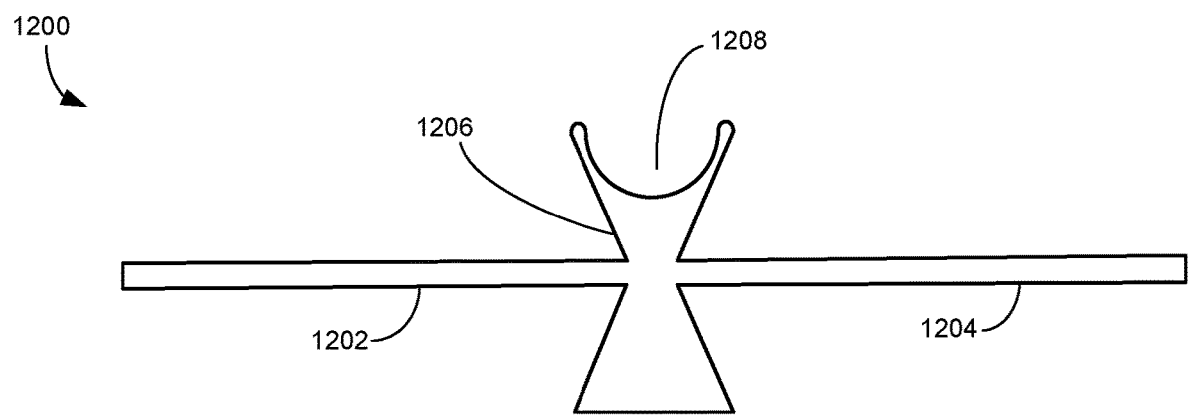
FIG. 12B illustrates an alternative reinforcement spacer, according to an embodiment.

In addition to the exemplary spacers shown in FIGS. 10A-11D, other types of spacers are also possible. For example, instead of extending throughout the length of the base, the two side wings may be shorter, such as partially extending along the length of the base, as shown in FIG. 12A. FIG. 12B illustrates an alternative reinforcement spacer, according to an embodiment. In this example, spacer 1200 can include wings 1202 and 1204, top groove 1208, and sloped sidewall 1206. Similar to the U- or V-shaped spacers, there can be a balance between the length of wings 1202 and 1204 and the strength and flexibility of the multi-tile module. In the example shown in FIG. 12B, wings 1202 and 1204 are much longer than the wings shown in FIG. 10A. These longer wings provide a strong adhesion to the roof tiles and can allow adjacent roof tiles to bend at 90°. In this example, top groove 1208 can also be curved rather than square, while still providing a visual appearance of a gap between the PV roof tiles. Finally, sloped sidewalls (e.g., sidewall 1206) can conceal the visual appearance of encapsulant material when viewed from the top of the PV roof tiles. Moreover, these sloped sidewalls can guide the flow of encapsulant during lamination by preventing overflow of the encapsulant.

During manufacturing, the spacer can facilitate alignment of the glass sheets within a multi-tile module. For example, the pre-laid spacers can be used as a visual guide for robotic arms that lay the top glass covers. Alternatively, the pre-laid spacers can be used as anchors for the glass covers. For example, when laying a glass cover, the robotic arm can push the glass cover against the spacer. Moreover, during final manufacturing steps (such as trimming and roof component attachment), it is necessary to handle the multi-tile module carefully to protect the bussing. The spacer can provide structural integrity and stiffness to the multi-tile module when the multi-tile module is being handled as a single piece.

Inter-Module Connections

Because the photovoltaic structures and the inner- and inter-tile electrical interconnects are encapsulated between the front and back covers of the solar tiles, external lead wires are needed to facilitate inter-module electrical interconnections. In conventional PV panels, external lead wires may access the solar cell electrodes via pre-cut slots at the back side of the PV panel. For example, bussing ribbons may reach, through pre-cut slots on the PV panel backsheet, a junction box attached to the back side of the PV panel. Similar approaches may be used in solar roof tiles or tile modules. For example, a pre-cut hole or slot can be created at the back side of the solar roof tile or tile module. After lamination, the metal tabs (e.g., metal tabs 710 and 712 shown in FIG. 7) can be brought out through the pre-cut hole. However, pulling a portion of a metal tab out of a pre-cut through slot or hole can require bending, folding, and sometimes trimming of the metal tab. These operations, including the pulling operation, typically are manual processes, which can be cumbersome and time-consuming. On the other hand, high throughput can be critical to the fabrication of solar roof tiles or tile modules. It can be preferable to have a system or process that can attach a junction box to a tile or tile module within a few seconds (e.g., two or three seconds). Manual operations certainly cannot meet such a challenge.

To solve this problem, in some embodiments, a unique junction box can be provided which can enable automated coupling between the junction box and encapsulated photovoltaic strings. More specifically, one or more through holes can be created on the back cover of a tile module to enable coupling between the junction box and the encapsulated photovoltaic strings.

FIG. 13A shows the bottom view of an exemplary multi-tile module, according to one embodiment of the present invention. For illustration purposes, the bottom covers of the solar roof tiles are shown as transparent. In practice, the bottom covers typically are non-transparent, such as back sheets or glass with dark colored coatings. Multi-tile module 1300 includes PV tiles 1302, 1304, and 1306, and each tile can include a number (e.g., six) of cascaded photovoltaic strips. Metal tabs 1308 and 1310 couple the PV tiles in parallel, such that edge busbars of positive polarity are coupled to metal tab 1308 and edge busbars of negative polarity are coupled to metal tab 1310. If one views multi-tile module 1300 as a battery, metal tabs 1308 and 1310 can provide the positive and negative outputs, respectively, of the battery. Hence, by allowing contacts between external lead wires and metal tabs 1308 and 1310, one can output power from multi-tile module 1300 via the external wires. In some embodiments, through holes can be created on the back cover of multi-tile module 1300 to enable electrical contacts between a pair of external lead wires and metal tabs 1308 and 1310.

In FIG. 13A, through holes 1312 and 1314 can be created on the back cover of tiles 1302 and 1306, respectively. More specifically, through hole 1312 can be positioned above a portion of metal tab 1308, and through hole 1314 can be created beneath a portion of metal tab 1310. To prevent encapsulant from flowing into the through holes during lamination, in some embodiments, an encapsulant-blocking ring can be placed around a through hole at the inner surface of the back cover. The encapsulant-blocking ring can be made of a material that can withstand the lamination temperature, such as polyethylene or other similar materials. The thickness of the ring can be between a few hundred microns to a few millimeters. Because the surface of the encapsulant-blocking ring is taller than the surface of the through hole, during lamination, the flow of encapsulant can be stopped by the encapsulant-blocking ring. As a result, the encapsulant will not contaminate metal tabs 1308 and 1310. Alternatively, a gasket (e.g., a rubber or PTFE O-ring) can be inserted into each through hole prior to the lamination process to prevent encapsulant from flowing into the through holes during lamination.

FIG. 13B shows the cross-sectional view along cut plane B-B', according to one embodiment. The arrows show the direction of the sunlight. In FIG. 13B, photovoltaic strip 1322 is positioned between back cover 1324 and front cover 1326, and metal tab 1308 is positioned adjacent to the front surface of photovoltaic strip 1322. Metal tab 1308 is coupled to a busbar located on the front surface of photovoltaic strip 1322. Through hole 1328 is created on back cover 1324, directly above a portion of metal tab 1308. Gasket 1330 is inserted inside through hole 1328 to create a passage to metal tab 1308. Encapsulant 1332 can fill the remaining void between front cover 1326 and back cover 1324. As one can see from FIG. 13B, a clear passage to metal tab 1308 can be formed by through hole 1328 and gasket 1330. By carefully designing the size and shape of gasket 1330 to match those of through hole 1328, one can prevent contamination of metal tab 1308 by encapsulant 1332 during lamination.

Figure 13C:
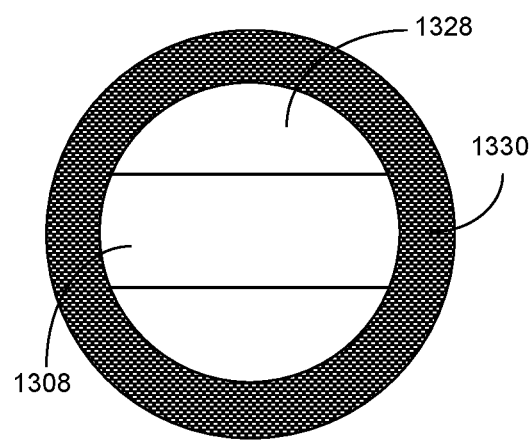
FIG. 13C shows the top view of the through hole, according to one embodiment.
Figure 13D:
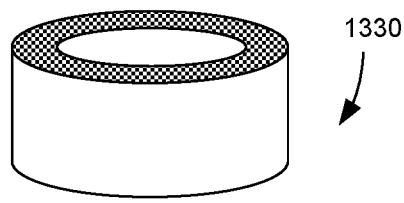
FIG. 13D shows an exemplary gasket, according to one embodiment.

FIG. 13C shows the top view of the through hole, according to one embodiment. In FIG. 13C, a portion of metal tab 1308 is exposed via through hole 1328. FIG. 13D shows an exemplary gasket, according to one embodiment. In some embodiments, gasket 1330 can be similar to an O-ring.

In some embodiments, a specially designed junction box can be used to facilitate electrical access to photovoltaic strings encapsulated with the tile module. More specifically, the junction box can include an electrical coupling mechanism configured to extend upwardly, from the bottom surface of the junction box, into the through hole, making contact with the exposed portion of the metal tab (e.g., metal tab 1308 or 1310). The electrical coupling mechanism can be in the form of an attachment pad that includes a flat (sometimes round) piece for making contact with the exposed portion of the metal tab and an extension post extending beyond the surface of the back cover. The busbar of the photovoltaic strip, the metal tab, and the attachment pad together can create a conductive path from one side of the photovoltaic strip to the exterior of the tile. In some embodiments, the extension post of the attachment pad can be enclosed inside a junction box, which can provide electrical insulation and weather protection for the attachment pad.

Figure 14A:
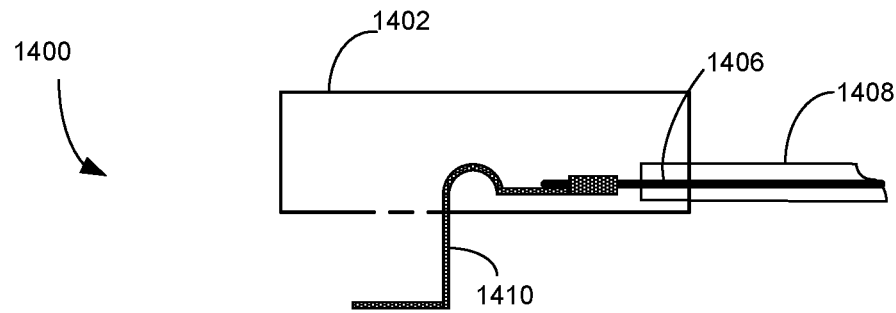
FIG. 14A shows the side view of an exemplary junction box, according to one embodiment.

FIG. 14A shows the side view of an exemplary junction box, according to one embodiment. In FIG. 14A, junction box 1400 can include physical enclosure 1402, specially designed attachment pad 1410, and lead wire 1406. Junction box 1400 can also include other conventional electrical components, such as bypass diodes, that are not shown in the drawing.

Physical enclosure 1402 can be a weatherproof container that houses the various electrical components (e.g., attachment pad 1410, lead wire 1406, bypass diodes, etc.), protecting the electrical circuitry from weather elements. In some embodiments, physical enclosure 1402 can include an opening on its surface facing the tile module to allow attachment pad 1410 to extend out of physical enclosure 1402 in a substantial vertical manner. Alternatively, a trap- or sliding-door can be created to allow attachment pad 1410 to extend out of physical enclosure 1402. Attachment pad 1410 can be made of a low-resistant material (e.g., a metallic material) and can extend out of physical enclosure 1402. In some embodiments, attachment pad 1410 can be inserted into a through hole located on the back cover of a tile module, making direct contact with a metallic electrode (e.g., metal tab 1308 or 1310 shown in FIG. 13) encapsulated within the tile module.

Lead wire 1406 can include a portion within junction box 1400 for coupling to attachment pad 1410 and a portion extending out of junction box 1400 for coupling to lead wires of other tile modules. In some embodiments, the inside portion of lead wire 1406 can include a bare copper wire, making a metal-to-metal contact with attachment pad 1410. The outside portion of lead wire 1406 can be inserted into weatherproof jacket 1408.

Figure 14B:
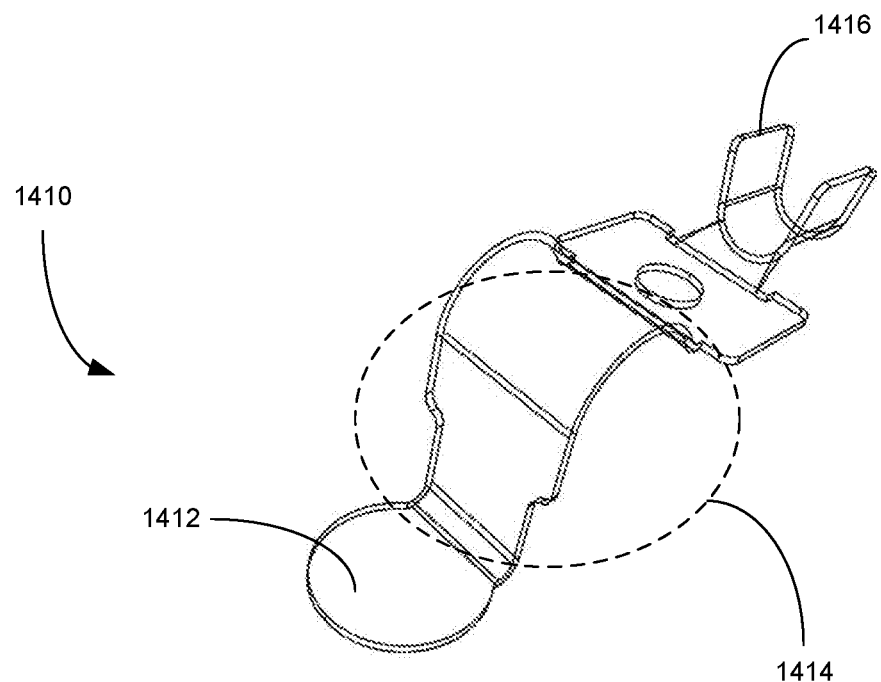
FIG. 14B shows the detailed view of an exemplary attachment pad, according to one embodiment.

FIG. 14B shows the detailed view of an exemplary attachment pad, according to one embodiment. Attachment pad 1410 can include a flat piece (or a contact pad) 1412, extension post 1414, and wire coupler 1416. Flat piece or contact pad 1412 can have various shapes, such as circular. When inserted into the through hole on the back cover of a tile module, contact pad 1412 can be in direct contact with the exposed portion of a metal tab that is electrically coupled to the edge busbar of the photovoltaic string. Note that, if a gasket has been placed inside the through hole, contact pad 1412 can be inserted into the gasket. In some embodiment, electrically conductive adhesive (ECA) can be applied to bond contact pad 1412 with the metal tab. Alternatively, solder can also be used to bond contact pad 1412 with the metal tab. Note that, when the tile module is in operation, contact pad 1412 is located on the back side of the tile module; hence, there is no need for a masking layer on the contact pad, making soldering a suitable option for bonding. In some embodiments, contact pad 1412 can be pre-coated with a layer of solder (e.g., Pb- or Sn-based solder, including $Sn_{62}Pb_{36}Ag_2$). After being inserted into the through hole, heat can be applied (e.g., by using a solder gun) locally to melt the solder, thus bonding contact pad 1412 to the metal strip inside the tile module.

Extension post 1414 can be designed in such a way that its length is at least equal to or greater than the thickness of the back cover. In some embodiments, the back cover of a tile module can include glass having a thickness of around 2.5 mm, and extension post 1414 can be slightly longer, extending out of the physical enclosure for about 2.5 mm. Hence, when extended vertically from the junction box, extension post 1414 can reach beyond the back cover, bringing contact pad 1412 into contact with an electrode of the photovoltaic string (e.g., a metal tab coupled to an edge busbar or an edge busbar itself). In some embodiments, extension post 1414 can include a curved neck portion as shown in FIG. 14B. Such a design can allow adjustment to be made to the extended length of extension past 1414. Wire coupler 1416 is positioned at the other end of extension post 1414, opposite to contact pad 1412. Wire coupler 1416 can be configured to couple to a lead wire. In some embodiments, wire coupler 1416 can be shaped like a half cylindrical surface. Wire coupler 1416 can also be pre-coated with a solder layer to facilitate coupling between wire coupler 1416 and the lead wire.

Attachment pad 1410 can be made of low-resistant metallic materials, such as Cu. In some embodiments, the three different components within attachment pad 1410 can be formed from a single piece of metal. Alternatively, they can be attached to each other by any suitable electrical connection, such as by soldering, welding, or bonding.

Figure 14C:
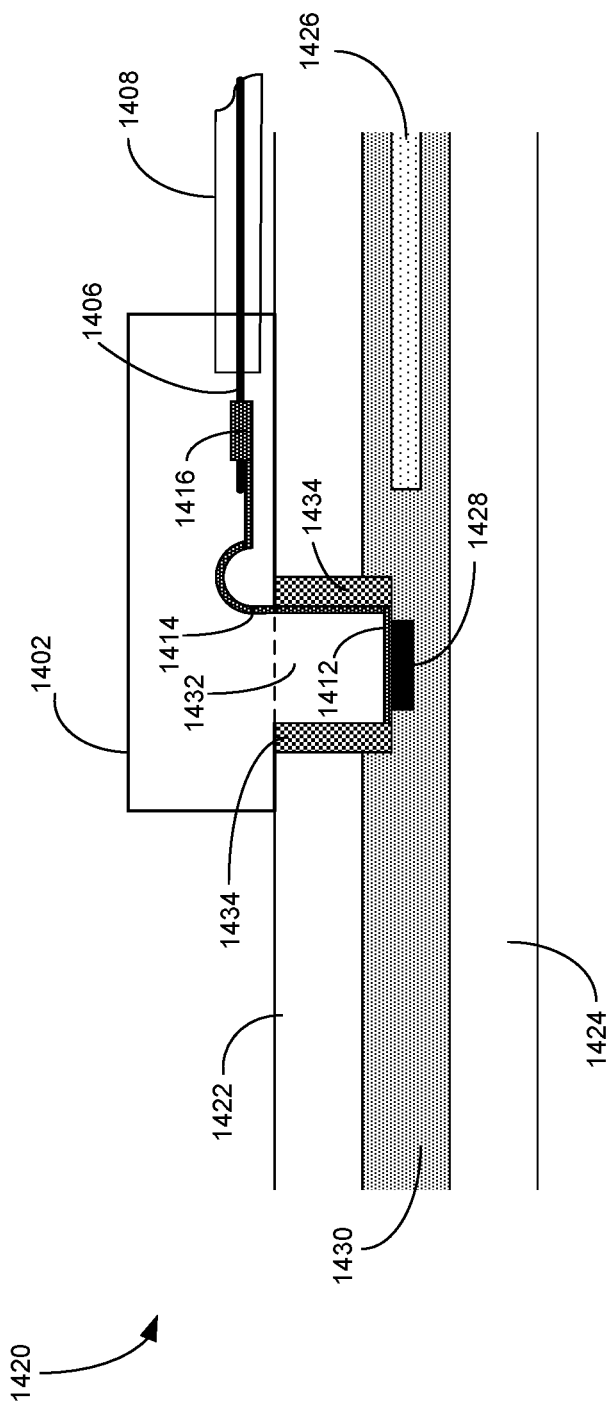
FIG. 14C shows the exemplary coupling between the junction box and the tile module, according to one embodiment.

FIG. 14C shows the exemplary coupling between the junction box and the tile module, according to one embodiment. More specifically, FIG. 14C shows the amplified view of a PV tile module at a location near the junction box. Tile module 1420 can include back cover 1422, front cover 1424, and photovoltaic strip 1426 encapsulated between back cover 1422 and front cover 1424. Metal tab 1428 is in contact with a busbar (e.g., an edge busbar) on photovoltaic strip 1426 and can be used to electrically couple photovoltaic strip 1426 with photovoltaic strips encapsulated in adjacent solar roof tiles. Through hole 1432 can be formed within back cover 1422 at a location directly above a portion of metal tab 1428. The location of through hole 1432 can be determined based on locations and/or sizes of other components of the tile module, such as the junction box, the inter-module spacer, etc. Gasket 1434 can be inserted into through hole 1432, preventing encapsulant 1430 from overflowing into through hole 1432 during lamination. As one can see in FIG. 14C, the rim of gasket 1434 is slightly over the inner surface of back cover 1422, thus effectively preventing the overflow of encapsulant 1430. Encapsulant 1430 can fill the remaining empty space between back cover 1422 and front cover 1424.

Physical enclosure 1402 of the junction box can be placed on back cover 1422, directly above through hole 1432. Because physical enclosure 1402 is weatherproof, when placed on top of through hole 1432, it can protect components exposed by through hole 1432 (e.g., metal tab 1428) from exposure to weather factors. An attachment pad can be inserted through gasket 1434, resulting in contact pad 1432 being in direct physical contact with metal tab 1428. In some embodiments, to ensure low-resistance contact, metal tab 1428 can include a widened section that is in contact with contact pad 1412. Extension post 1414 of the attachment pad extends out of through hole 1432 into physical enclosure 1402. Inside enclosure 1402, lead wire 1406 can be coupled to wire coupler 1416 of the attachment pad. In some embodiments, lead wire 1406 can include bare copper wire. The coupling can include a metal-to-metal contact. Before exiting junction box enclosure 1402, lead wire 1406 can be inserted into weatherproof jacket 1408. The length of external portion of lead wire 1406 can be determined based on the size of the tile module. It is desirable for the lead wire to be long enough to be able to couple to lead wires from adjacent tile modules.

Figure 15:
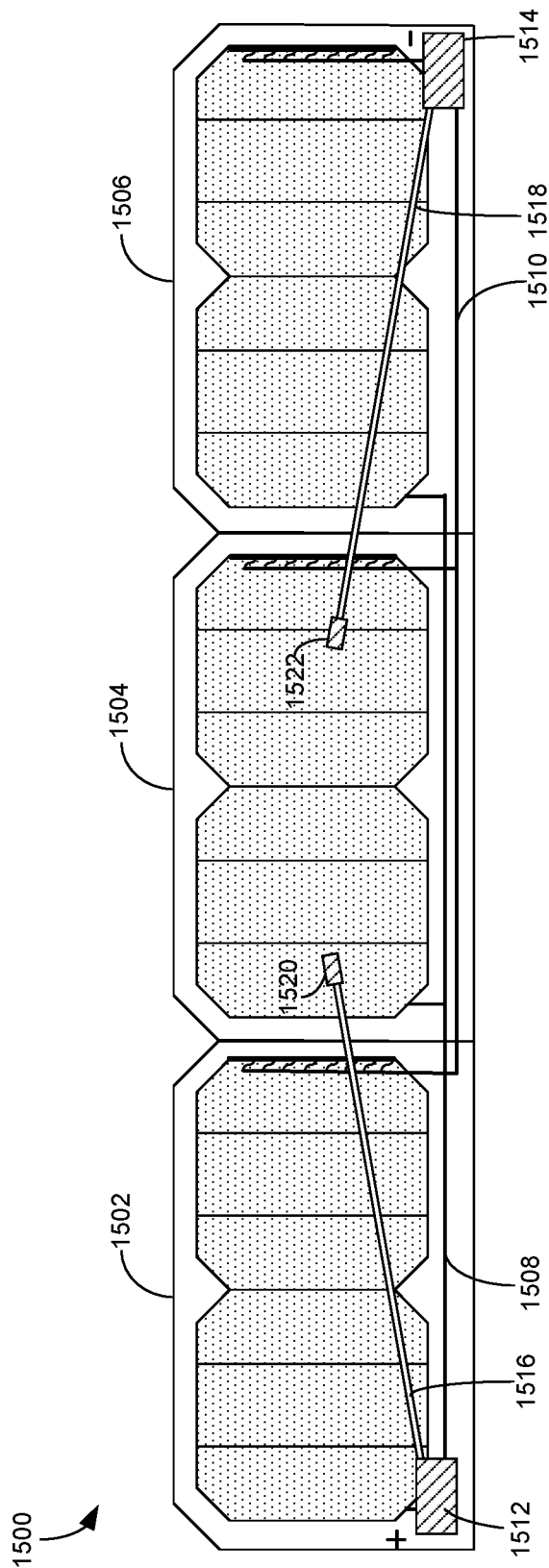
FIG. 15 shows the bottom view of an exemplary multi-tile module, according to one embodiment of the present invention.

FIG. 15 shows the bottom view of an exemplary tile module, according to one embodiment of the present invention. Multi-tile module 1500 can include three PV tiles 1502, 1504, and 1506. In some embodiments, PV tiles 1502, 1504, and 1506 can be coupled in parallel via metal tabs 1508 and 1510. For example, metal tab 1508 can be coupled to positive-polarity busbars of all PV tiles within the module, whereas metal tab 1510 can be coupled to negative-polarity busbars of all PV tiles. Multi-tile module 1500 can also include junction boxes 1512 and 1514, both positioned on the back side of multi-tile module 1500. Similar to junction box 1400 shown in FIG. 14A, junction boxes 1512 and 1514 facilitate electrical coupling between weatherproof lead wires and metal tabs that couple the PV roof tiles. For example, junction box 1512 facilitates electrical coupling between weatherproof lead wire 1516 and metal tab 1508. Similarly, junction box 1514 facilitates electrical coupling between weatherproof lead wire 1518 and metal tab 1510. Therefore, weatherproof lead wires 1516 and 1518 are electrically coupled to the positive and negative polarities, respectively, of all PV tiles. Each weatherproof lead wire can also include a cable coupler, also weatherproof, for coupling to a lead wire of another tile module. Lead wire 1516 includes a cable coupler 1520, and lead wire 1518 includes a cable coupler 1522. During roof installation, depending on the layout and electrical design of the roof, an installer can interconnect individual multi-tile modules using the weatherproof lead wires. Additional bussing cables may also be used to facilitate inter-module electrical couplings.

The unique design of the junction boxes facilitates easy electrical access to a photovoltaic structure or string encapsulated inside the PV tile modules, thus enabling robust design of module interconnections. In the examples shown in FIGS. 7 and 15, the multiple PV roof tiles within a multi-tile module are arranged horizontally. In practice, it is also possible to arrange the multiple PV tiles within a module vertically. Regardless of the shape and size of a tile module, the specially designed junction box can be used for inter-module electrical connections. In some embodiments, a tile module may contain only a single PV roof tile, and the junction boxes attached to the back cover of the tile module can be configured to electrically access the edge busbars of the encapsulated photovoltaic string in a similar way. For example, the attachment pad may couple directly to an edge busbar (e.g., the edge busbar on the back side of the string), or it may couple to an edge busbar (e.g., the edge busbar on the front side of the string) via a strain-relief connector. The single-tile module can provide additional layout flexibility and can be combined with multi-tile modules when forming a roof.

Module Fabrication

Figure 16:
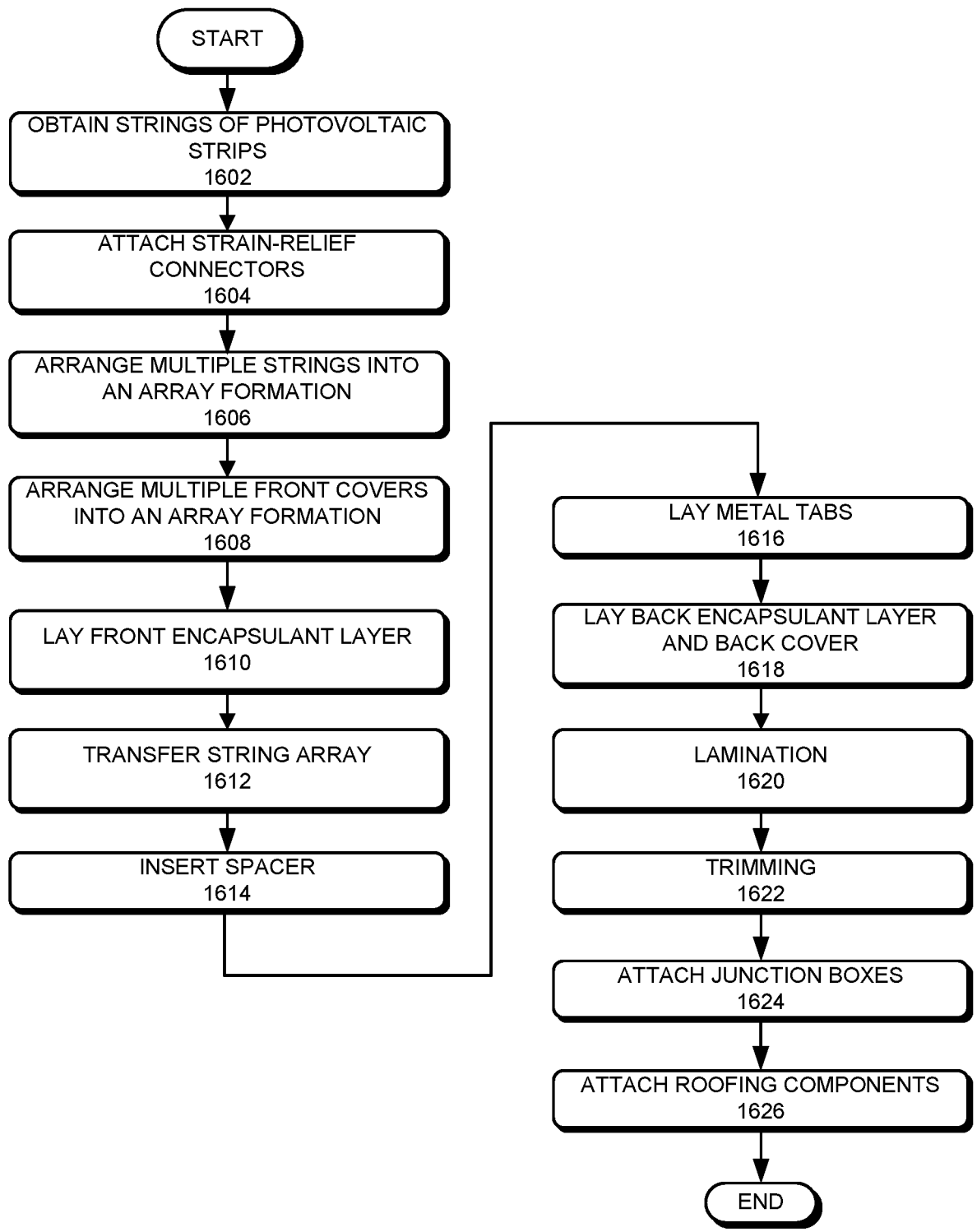
FIG. 16 shows an exemplary fabrication process of a photovoltaic roof module, according to an embodiment of the invention.

FIG. 16 shows an exemplary fabrication process of a photovoltaic roof module, according to an embodiment of the invention. During fabrication, one or more strings of photovoltaic strips can be obtained (operation 1602). More specifically, photovoltaic strips can be obtained by dividing a standard square or pseudo-square solar cell into multiple pieces, and a string of strips can be formed by cascading multiple strips at the edges. The cascading forms a serial connection among the strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, each individual solar roof tile may include one string, and each string can include six cascaded strips. The outputs of a string are busbars located at opposite sides and edges of the string. Additional busbars may also be added to the string to satisfy the spatial constraints imposed onto the junction boxes. An additional busbar can run alongside an edge busbar but is away from the edge. Subsequent to the formation of a string, strain-relief connectors can be attached to appropriate busbars (e.g., an edge busbar or an additional busbar away from the edge) (operation 1604). Various electrical coupling methods can be used to attach the strain-relief connectors to the busbars, including but not limited to: soldering, welding, or bonding with electrically conductive adhesive (ECA). In some embodiments, the strain-relief connectors may be coated with a masking layer (e.g., a layer of acrylic paint), and to protect the integrity of the masking layer, ECA is used to bond the strain-relief connectors to the busbars. Because the busbars can reside on opposite sides of the photovoltaic string, attaching the strain-relief connectors to the busbars may require flipping over the string.

Multiple strings along with their strain-relief connectors can then be arranged into a matrix or array formation that corresponds to the formation of a tile module (operation 1606). For example, to obtain a multi-tile module having three side-by-side tiles (e.g., as shown in FIG. 7), three strings can be arranged along a straight line, and the distance between adjacent strings can be determined based on the size of the tiles and the gap between the tiles. Similarly, front covers of multiple solar roof tiles can be arranged into a formation that corresponds to the formation of the tile module (operation 1608), and front encapsulant layer can be laid on the covers (operation 1610).

In some embodiments, three separate covers, each corresponding to a respective tile, can be used for the tile module. Alternatively, a single piece of glass cover can be used for all three tiles, and grooves can be etched on the single glass cover to create the appearance of three individual roof tiles. In a further embodiment, the front cover of the tile module may include three separate pieces of glass, whereas the back cover of the tile module may include a single continuous backsheet. Similarly, the encapsulant layer can be three separate pieces or a continuous piece of material.

The array of strings can then be transferred and placed on top of the front encapsulation layer and covers (operation 1612), and spacers can be inserted between adjacent tiles (operation 1614). Note that the spacer may not be used if both the front and back covers are made of a single piece of glass.

Metal tabs (e.g., metal tabs 710 and 712 shown in FIG. 7) can then be laid out, directly contacting the strain-relief connectors (operation 1616). In some embodiments, metal tabs can be laid out in such a way that the multiple strings can be coupled to each other in parallel. ECA can also be used to electrically and mechanically couple the metal tabs and strain-relief connectors. The metal tabs may need to be laid out in such a way that they can thread through the channels formed on the bases/ridges of the spacers. In some embodiments, additional plastic pieces can be used to cover the channels after the metal tabs have been placed in position. Subsequently, a back encapsulant layer and a back cover (or multiple back covers) are laid on top of the array of strings (operation 1618). In some embodiments, the back encapsulant layer and the back cover of the tile module can include through holes, and gaskets can be inserted inside the through holes. The locations of the through holes are carefully designed in such a way that at least a portion of the metal tabs can be exposed by the through holes. This also requires precise placement of the back covers. In some embodiments, the back covers can be laid down using the spacers as alignment aids. For example, an automated tool laying down the back covers may use the spacers as a visual guide to align an edge of a back cover to an edge of a spacer.

A lamination process can then be performed to encapsulate the strings, the strain-relief connectors, and the metal tabs between the front and back covers (operation 1620). The gaskets inserted into the through holes create a clear path to an exposed portion of the metal tabs. Subsequent to the lamination, the edges of the multi-tile module can be trimmed to eliminate excessive encapsulant (operation 1622) and the junction boxes are attached (operation 1624). Attaching a junction box can include inserting the attachment pad pre-fabricated within the junction box into the center of the gasket. In some embodiments, an automated operation can be performed to place the junction box on a predetermined location of the back cover such that the attachment pad extruding out of the junction box can fall within the through hole on the back cover. Heat can be applied locally to solder the attachment pad to the metal strip exposed by the through hole. For example, the junction box can have a removable cover to allow a solder gun to approach the attachment pad during installation of the junction boxes. In addition to attaching the junction boxes, roofing components (e.g., components that can facilitate the attachment of the multi-tile module onto a roof batten) can be attached to the back side of the multi-tile module to complete the fabrication process (operation 1626).

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof module, comprising:
 a plurality of photovoltaic roof tiles, wherein a respective photovoltaic roof tile comprises:
  a glass front cover;
  a back cover; and
  a plurality of photovoltaic structures arranged into a cascaded string which is encapsulated between the glass front cover and the back cover by an encapsulant;
 a plurality of tile spacers, wherein a respective tile spacer is electrically insulating and is positioned between a first photovoltaic roof tile and a second adjacent photovoltaic roof tile, and wherein the tile spacer is configured to substantially fill a space between the first and second photovoltaic roof tiles to prevent water leakage through the space;
 wherein the cascaded string within the first photovoltaic roof tile and the cascaded string within the second photovoltaic roof tile are electrically coupled to each other in parallel via a metallic tab extending from the first photovoltaic roof tile across the tile spacer to the second photovoltaic roof tile;
 wherein the metallic tab is coupled to a corresponding cascaded string via a strain-relief connector, which comprises an elongated member and a plurality of laterally extended wires; and
 wherein the photovoltaic roof tile is configured to function as a roof tile when placed on a rooftop of a building, thereby protecting the building from weather elements.

2. The photovoltaic roof module of claim 1, wherein a respective photovoltaic structure comprises a first edge busbar positioned near an edge of a first surface and a second edge busbar positioned near an opposite edge of a second surface, and wherein the plurality of photovoltaic structures is arranged in such a way that the first edge busbar of a first photovoltaic structure overlaps the second edge busbar of an adjacent photovoltaic structure, thereby forming a cascaded string.

3. The photovoltaic roof module of claim 1, wherein the strain-relief connector is coupled to the corresponding edge busbar via electrically conductive adhesive.

4. The photovoltaic roof module of claim 1, wherein the tile spacer comprises a ridge and two wings extending from the ridge in opposite directions, wherein a respective wing of the tile spacer is embedded within the encapsulant positioned between the glass front cover and the back cover of a corresponding photovoltaic roof tile.

5. The photovoltaic roof module of claim 1, wherein the ridge comprises:
 a groove extending along a longitudinal axis of the ridge on a top surface, thereby creating a visual effect of a gap between the adjacent photovoltaic roof tiles; and
 a channel on a bottom surface configured to allow the metallic tab to extend across the tile spacer.

6. The photovoltaic roof module of claim 1, further comprising a junction box positioned on the back cover of a particular photovoltaic roof tile, wherein the junction box comprises a physical enclosure and an attachment pad extended substantially vertically out of a surface of the physical enclosure, and wherein the attachment pad is configured to electrically access, via a through hole on the back cover, photovoltaic structures encapsulated within the particular photovoltaic roof tile.

7. The photovoltaic roof module of claim 6, wherein the attachment pad comprises:
 an extension post for extending out of the junction box;
 a contact pad coupled to a first end of the extension post, wherein the contact pad is configured to be electrically and mechanically coupled to an electrode of the photovoltaic structures encapsulated within the particular photovoltaic roof tile; and
 a wire coupler coupled to an opposite end of the extension post, wherein the wire coupler is configured to be electrically and mechanically coupled to a lead wire, with a portion of the lead wire extending out of the physical enclosure.

8. A method for fabricating a photovoltaic roof module, the method comprising:

obtaining a plurality of cascaded strings of photovoltaic structures; and encapsulating the cascaded strings of photovoltaic structures between front and back covers of a plurality of photovoltaic roof tiles, wherein a respective cascaded string is encapsulated between front and back covers of a respective photovoltaic roof tile, wherein the cascaded string within a first photovoltaic roof tile and the cascaded string within a second adjacent photovoltaic roof tile are electrically coupled to each other in parallel via a metallic tab, wherein the metallic tab is coupled to a corresponding cascaded string via a strain-relief connector, which comprises an elongated member and a plurality of laterally extended wires; and inserting an electrically insulating tile spacer to substantially fill a space between the first and second photovoltaic roof tiles to prevent water leakage through the space;

wherein the metallic tab extends from the first photovoltaic roof tile across the tile spacer to the second photovoltaic roof tile, and wherein each photovoltaic roof tile is configured to function as a roof tile when placed on a rooftop of a building, thereby protecting the building from weather elements.

9. The method of claim 8, wherein a respective photovoltaic structure comprises a first edge busbar positioned near an edge of a first surface and a second edge busbar positioned near an opposite edge of a second surface, and wherein obtaining the cascaded string of photovoltaic structures comprises arranging a plurality of photovoltaic structures in such a way that the first edge busbar of a first photovoltaic structure overlaps the second edge busbar of an adjacent photovoltaic structure.

10. The method of claim 8, further comprising applying electrically conductive adhesive in order to couple the strain-relief connector to the corresponding edge busbar.

11. The method of claim 8, wherein the tile spacer comprises a ridge and two wings extending from the ridge in opposite directions, wherein a respective wing of the tile spacer is embedded within an encapsulant positioned between the front and back covers of a corresponding photovoltaic roof tile.

12. The method of claim 8, wherein the ridge comprises:
a groove extending along a longitudinal axis of the ridge on a top surface, thereby creating a visual effect of a gap between the adjacent photovoltaic roof tiles; and
a channel on a bottom surface configured to allow the metallic tab to extend across the tile spacer.

13. The method of claim 8, further comprising attaching a junction box on the back cover of a particular photovoltaic roof tile, wherein the junction box comprises a physical enclosure and an attachment pad extended substantially vertically out of a surface of the physical enclosure, and wherein the attachment pad is configured to electrically access, via a through hole on the back cover, photovoltaic structures encapsulated within the particular photovoltaic roof tile.

14. The method of claim 13, wherein the attachment pad comprises:
an extension post for extending out of the junction box;
a contact pad coupled to a first end of the extension post, wherein the contact pad is configured to be electrically and mechanically coupled to an electrode of the photovoltaic structures encapsulated within the particular photovoltaic roof tile; and
a wire coupler coupled to an opposite end of the extension post, wherein the wire coupler is configured to be electrically and mechanically coupled to a lead wire, with a portion of the lead wire extending out of the physical enclosure.

* * * * *